US011183832B2

(12) United States Patent
Dusmez et al.

(10) Patent No.: US 11,183,832 B2
(45) Date of Patent: Nov. 23, 2021

(54) METHODS, APPARATUS, AND SYSTEMS TO FACILITATE A FAULT TRIGGERED DIODE EMULATION MODE OF A TRANSISTOR

(71) Applicant: Texas Instruments Incorporated, Dallas, TX (US)

(72) Inventors: Serkan Dusmez, Plano, TX (US); Nathan Richard Schemm, Rowlett, TX (US); Salil Chellappan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 336 days.

(21) Appl. No.: 16/366,813

(22) Filed: Mar. 27, 2019

(65) Prior Publication Data
US 2020/0313421 A1 Oct. 1, 2020

(51) Int. Cl.
| | |
|---|---|
| *H02H 5/00* | (2006.01) |
| *H02H 5/04* | (2006.01) |
| *H02H 1/00* | (2006.01) |
| *H02H 7/12* | (2006.01) |

(52) U.S. Cl.
CPC ............ *H02H 5/04* (2013.01); *H02H 1/0007* (2013.01); *H02H 7/1213* (2013.01)

(58) Field of Classification Search
None
See application file for complete search history.

(56) References Cited

U.S. PATENT DOCUMENTS

| | | | |
|---|---|---|---|
| 8,072,204 B1 | 12/2011 | Heineman et al. | |
| 9,431,838 B2 * | 8/2016 | Newlin | H02J 7/00 |
| 9,923,467 B2 * | 3/2018 | Lee | H02M 3/1584 |
| 2010/0066323 A1 | 3/2010 | Moussaoui | |
| 2013/0271101 A1 | 10/2013 | Nanov | |
| 2014/0021932 A1 * | 1/2014 | Ejury | H02M 1/08 323/311 |
| 2014/0253072 A1 * | 9/2014 | Hussien | H02M 1/36 323/281 |
| 2014/0266010 A1 * | 9/2014 | Newlin | H02J 7/00 320/107 |

OTHER PUBLICATIONS

International Search Report dated Jun. 18, 2020, PCT Application No. PCT/US2020/024819, 2 pages.
Written Opinion dated Jun. 18, 2020, PCT Application No. PCT/US2020/024819, 4 pages.

\* cited by examiner

*Primary Examiner* — Stephen W Jackson
(74) *Attorney, Agent, or Firm* — Michelle F. Murray; Charles A. Brill; Frank D. Cimino

(57) ABSTRACT

Methods, systems, and apparatus to facilitate a fault triggered diode emulation mode of a transistor. An example apparatus includes a driver to output a control signal to a gate terminal of a transistor of a power converter; and a diode emulation control circuit to, in response to determining a fault corresponding to the transistor, enable the transistor when current flows in a direction from a source terminal of the transistor to a drain terminal of the transistor.

40 Claims, 12 Drawing Sheets

METHODS, APPARATUS, AND SYSTEMS TO FACILITATE A FAULT TRIGGERED DIODE EMULATION MODE OF A TRANSISTOR

FIELD OF THE DISCLOSURE

This disclosure relates generally to power converters and, more particularly, to methods, apparatus, and systems to facilitate a fault triggered diode emulation mode of a transistor.

BACKGROUND

A power converter is a circuit that is used in various devices to convert an input voltage to a desired output voltage. For example, a buck converter converts an input voltage into a lower output voltage by controlling transistors and/or switches to charge and/or discharge inductors and/or capacitors to maintain the desired output voltage. Some power converters may include one or more power switches that may be switched on and/off in synchronization (e.g., when one switch is on the other is off) to change the path of current in the power converters. In some examples, such as in high voltage power converters, wide band gap devices may be used to implement the power switches for high voltage and/or high temperature power switching applications.

SUMMARY

Certain examples disclosed herein facilitate a fault triggered diode emulation mode of a transistor. An example system includes a driver to output a control signal to a gate terminal of a transistor of a power converter. The example system further includes a diode emulation control circuit to, in response to determining a fault corresponding to the transistor, enable the transistor when current flows in a direction from a source terminal of the transistor to a drain terminal of the transistor.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION

Figure 1A:
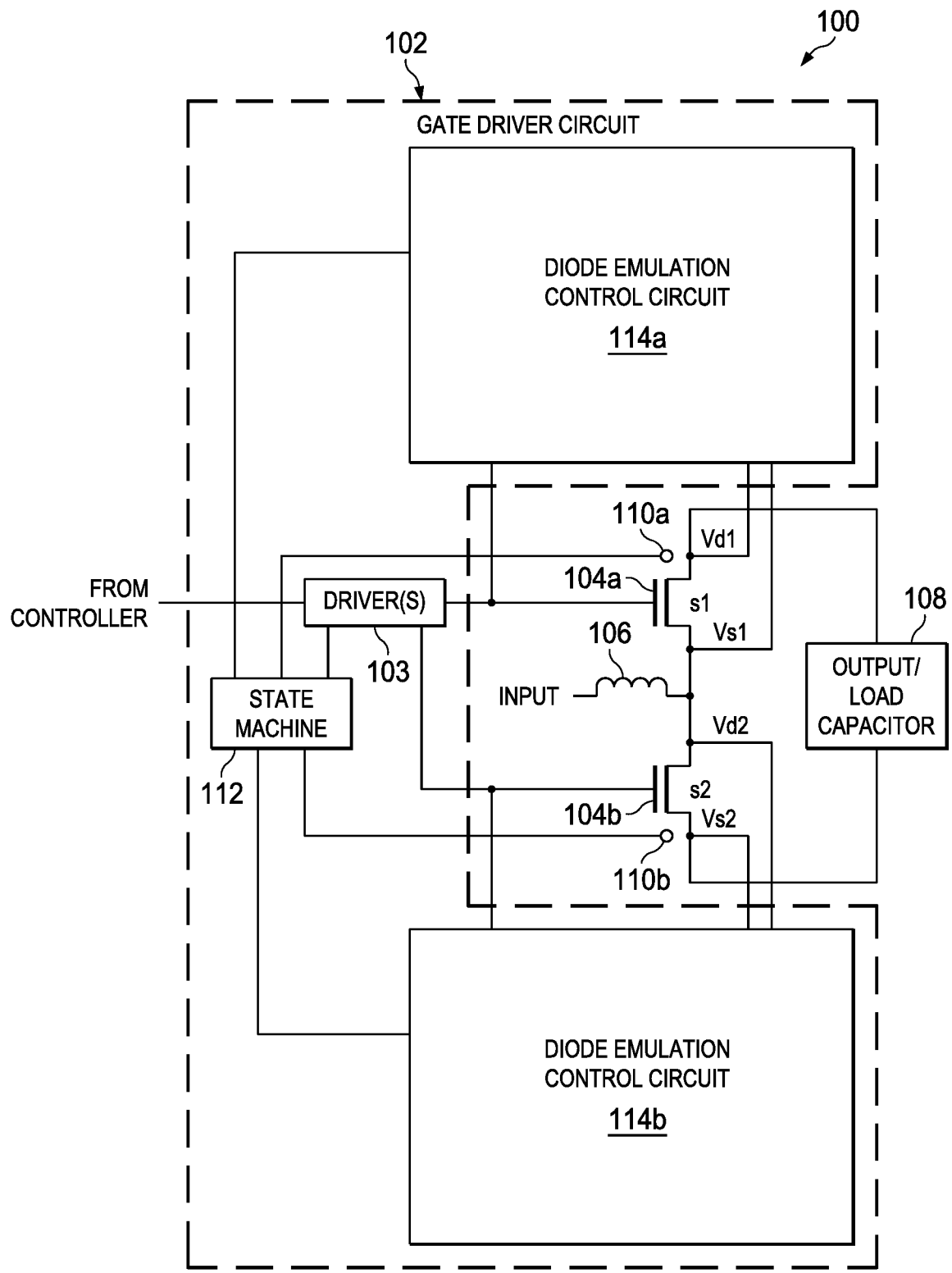
FIG. 1A illustrates an example switching power converter constructed in accordance with teaching disclosed herein.

Power converters (e.g., buck converters, boost converters, alternating current (AC)-AC converters, direct current (DC)-DC converters, AC-DC converters, etc.) may include power switches (e.g., relays, metal oxide silicon field effect transistors (MOSFETs), etc.) in a power stage (e.g., a single-channel power stage, a zero-voltage-switching auxiliary cell, a half-bridge power stage, a totem pole power factor correction (PFC) converter, a three-phase inverter, a full-bridge power stage, a two inductor and one capacitor (LLC) converter, a phase-shifted full-bridge, a dual active bridge converter, etc.) that switch currents from one path (e.g., from a voltage source (Vdd) to an output) to another (e.g., from the output to ground). Such converters are used in a PFC and/or DC/DC stage of a server and/or telecom, personal electronics, industrial power supplies, automotive DC/DC chargers, automotive on board chargers, industrial motor drives, etc. In such converters, a microcontroller outputs a control signal(s) to a low side switch and/or a high side switch. For example, a first control signal may be transmitted to the low side switch to enable the low side switch while a second control signal may be transmitted to the high side switch to disable the high side switch, thereby decreasing the output voltage of the power converter. In such an example, a first control signal may be transmitted to the low side switch to disable the low side switch while a second control signal may be transmitted to the high side switch to enable the high side switch, thereby increasing the output voltage of the power converter. The microcontroller may output the control signal(s) to toggle between high side control (e.g., by enabling the high side switch and disabling the low side switch) and the low side control (e.g., by disabling the high side switch and enabling the low side switch) at a frequency modulation and/or pulse width modulation to generate a desired output voltage.

In some examples, the low side and/or high side switches of a half bridge converter is implemented using gallium nitride transistors (e.g., switches). Group III-V devices (e.g., Gallium nitride (GaN) switches) are wide band gap transistors that may be used to implement the switching devices of a power converter. GaN switches (e.g., transistors) have very high breakdown voltages (e.g., reverse bias breakdown voltages that can be greater than a minimum breakdown voltage), high electron mobility and saturation velocity. Accordingly, GaN switches are used in high-power and/or high-frequency power converters or other high-voltage switching devices. GaN transistors include a thick layer of highly resistive GaN layer between a layer (e.g., a silicon layer, a second GaN layer, and/or other layer) and the source, gate, and drain of the transistor.

Some wide bandgap devices, such as GaN transistors, lack an inherent body diode. However, when a GaN transistor is coupled to a device/component (e.g., an inductor, a capacitor, etc.) and the GaN transistor is turned off, the device/component may force current to flow from the source to the drain of the GaN transistor. When the GaN transistor is off and more than a threshold amount of current flows from the source to the drain of the GaN transistor, the GaN transistor may begin to conduct causing the GaN to operate in a third quadrant mode and/or operation. Third quadrant mode and/or operation occurs when a voltage at the gate of the GaN transistor is low enough to turn off the GaN transistor and a voltage at the drain of the GaN transistor is more than a threshold voltage below the voltage at the source of the GaN transistor. Third quadrant mode and/or operation of a GaN transistor corresponds to the GaN transistor turning on and conducting in the reverse direction (e.g., causing current flowing from a device toward the source of the GaN transistor to continue to flow toward the drain of the GaN transistor). During third quadrant mode (e.g., while conducting in the reverse direction), the GaN exhibits a channel resistance that corresponds to a large voltage drop across the source and drain of the GaN (e.g., due to the characteristics of a GaN transistor). A large voltage drop across the GaN transistor while conducting results in large power dissipation. Accordingly, turning off a GaN transistor by decreasing the voltage to the gate of the GaN transistor may result in third-quadrant operation causing a large power dissipation corresponding to the GaN increasing temperature because of the large power dissipation. Temperatures above a threshold may cause damage to the GaN transistor. Accordingly, turning off a GaN transistor when a temperature-based fault occurs (e.g., when the GaN becomes too hot), may unintentionally result in third quadrant operation of the GaN, which may further increase the temperature of the GaN and potentially cause damage.

Some power converters include a shutdown protocol that may be implemented by a driver or other device that turns off the power converter in response to a fault (e.g., an unexpected and/or undesirable event). The shutdown protocol is designed to turn off the power converter to avoid damage to components of the power converter. For example, some power converters include a thermal shutdown that turns off the power converter when one or more of the switches of a power converter becomes too hot (e.g., above a threshold temperature). If a temperature above the threshold temperature is sensed, the operation of the power converter is shutdown to avoid the temperature from continuing to increase, which may cause damage to the power converter. However, as described above, GaN transistors have high heat dissipation when operating in the third quadrant. If a shutdown protocol turns off a GaN transistor at a time when a component (e.g., an inductor) is forcing current in the reverse direction through the GaN transistor, the current from the component may cause the GaN transistor to enter third quadrant, thereby causing a large voltage drop corresponding to a large power dissipation, resulting in an increase in temperature. Accordingly, although turning off the GaN transistor during a thermal shutdown while there is positive current in the GaN transistor will reduce temperature and is the desired response (e.g., because the GaN will not enter third-quadrant mode and will not conduct) turning off the GaN transistor when over-temperature is detected while there is reverse current in the GaN causes the temperature to increase, as opposed to decrease. As described above, if the temperature increases too high, the GaN transistor may be damaged.

Examples disclosed herein include a fault protocol (e.g., an over-temperature fault protocol) designed to prevent the GaN transistor from entering the third quadrant mode, thereby avoiding the increased power dissipation associated with the third quadrant mode to avoid increasing the temperature. Examples disclosed herein facilitate a diode emulation mode of the GaN transistor by controlling the GaN transistor to prevent the GaN transistor from entering the third quadrant mode. By operating in the diode emulation mode, the GaN transistor operates like a diode to allow current to flow in a first direction (e.g., from the source to the drain of the GaN transistor) and limit and/or restrict current from flowing in the opposite direction of the first direction (e.g., from the drain to the source of the GaN transistor). Accordingly, when a fault occurs (e.g., a thermal fault), instead of turning the GaN transistor off, examples disclosed herein (A) turn off the GaN transistor when the current flows in the second direction to prevent the input component from charging, and (B) turn on the GaN transistor when the current flows in the first direction to allow the current from the input component to flow to the output component with less heat dissipation than the heat dissipation corresponding to the third-quadrant mode (e.g., due to the large source-to-drain voltage drop of the GaN transistor in third-quadrant mode).

To implement the fault shutoff protocol corresponding to diode emulation control of a GaN, in response to determining a fault (e.g., a sensed temperature being more than a threshold) corresponding to a GaN switch, examples disclosed herein, in one implementation, for example, measure the drain-to-source voltage. In another implementation, for example, in response to determining the fault corresponding to the GaN switch, examples disclosed herein determine whether the drain-to-source voltage is positive or negative based a comparison of the voltage at the drain of the GaN switch and a voltage at the source of the GaN switch. In yet another implementation, for example, in response to determining the fault corresponding to the GaN switch, examples disclosed herein measure the drain-to-source current of the GaN switch. In yet another implementation, for example, in response to determining the fault corresponding to the GaN switch, examples disclosed herein measure the direction of the drain-to-source current of the GaN switch. If the drain-to-source voltage and/or current is positive during a shutdown (e.g., output current flowing from a load and/or output component toward the drain of the GaN transistor), third quadrant mode will not occur. Accordingly, examples disclosed herein keep the GaN switch disabled. However, if the drain-to-source voltage and/or current is negative (e.g., input current flowing from a device and/or component (e.g., an inductor away from the drain of the GaN transistor) during a shutdown, third quadrant mode may occur. Accordingly, example disclosed herein enable (e.g., fully or partially) the GaN switch to prevent third quadrant mode of the GaN switch during faults when the current flows toward the source of the GaN switch.

Once enabled (e.g., fully or partially), the voltage drop across the GaN transistor corresponds to the drain-to-source on resistance (RDSON) of the GaN transistor. Because RDSON is small in GaN transistors, the voltage drop across the GaN transistor (e.g., the source-to-drain voltage) while reverse current flows through the GaN transistor while the GaN is ON is much lower than the voltage drop across the GaN transistor (e.g., the source-to-drain voltage) when the GaN transistor is off and the reverse current flows while the GaN is operating in third-quadrant. Accordingly, the present disclosure provides a solution to lower the power dissipation to avoid further increasing the temperature during an over temperature (OT) shutdown mode of a GaN transistor. As used herein, the terms "coupled" and "operatively coupled" are defined as connected directly or indirectly (e.g., through one or more intervening structures and/or layers, such as resistors, capacitors, inductors, transistors, voltage clamps, switches, buffers amplifiers, etc.).

FIG. 1A illustrates an example power stage 100 (e.g., a half-bridge switching power stage) to converter an input voltage (Vin) and/or input current to a desired output voltage. The power stage 100 includes an example gate driver circuit 102, example driver(s) 103, a first example switches 104a (e.g., example switch s1 104b), a second example switch 104b (e.g., example switch s2 104b), an example inductor 106, example temperature sensors 110a, 110b, an example state machine 112, and example diode emulation control circuits 114a, 114b. The example power stage 100 is connected an example output load/capacitor 108. Components of the example power stage 100 may be implemented into one or more dies. For example, silicon based components (e.g., the example gate driver circuit 102, the example temperature sensors 110a, 110b, and/or the example inductor 106) may be implemented in a first die and the GaN components (e.g., the example switches 104a, 104b) may be implemented in a second die. In such examples, the two dies may be integrated into a signal package, thereby corresponding to the example power stage 100.

The gate driver circuit 102 of FIG. 1A is coupled to (e.g., directly or indirectly) the terminal(s) of the example switches 104a, 104b, the temperature sensors 110a, 110b. The gate driver circuit 102 may be implemented by one or more integrated circuits, logic circuits, microprocessors, or controllers from any desired family or manufacturer. The gate driver circuit 102 includes the example driver(s) 103 to transmit a first control signal to the gate of the example switch 104a and a second control signal to the gate of the example switch 104b based on instructions from a controller. The example driver(s) 103 may be one driver or two drivers (e.g., one for the first switch 104a and one for the second switch 104b). The first and second control signals from the controller may be pulse width modulated (PWM) signals that toggle between a first phase and a second phase. Accordingly, based on the control signals from the controller, in a first phase, the example driver(s) 103 transmit(s) a first voltage (e.g., a high voltage) to the gate of the example switch s2 104b to enable the example switch s2 104b and transmits a second voltage (e.g., a low voltage) to the gate of the example switch s1 104a to disable the example switch s1 104a. When the example switch s1 104a is disabled and the example switch s2 104b is enabled, the input voltage charges the example inductor 106. In a second phase, the example driver(s) 103 transmit(s) the second voltage (e.g., the low voltage) to the gate of the example switch s2 104b to disable the example switch s2 104b and transmits the first voltage (e.g., the high voltage) to the gate of the example switch s1 104a to enable the example switch s1 104a. When the example switch s1 104a is enabled and the example switch s2 104b is disabled, the input voltage discharges the example inductor 106, thereby providing current to the example output load/capacitor 108. The duration of the first phase and the second phase corresponds to the output voltage at the output load/capacitor 108. When a fault (e.g., a thermal fault) occurs, the example driver(s) 103 cease(s) (e.g., halt(s), stop(s), pause(s), etc.) the PWM control signals, allowing one or more of the example diode emulation control circuits 114a, 114b to apply synchronized switching to control one or more of the switch s1 104a and the switch s2 104b to operate like an ideal diode. In some examples, the state machine 112 or the controller transmits a fault signal to the driver(s) 103 to cease operation. When the fault (e.g., thermal fault) ends, the driver(s) 103 restart(s) the PWM control signals (e.g., based on instructions from the example state machine 112 and/or the controller). The example gate driver circuit 102 also includes the example state machine 112 and the example diode emulation control circuits 114a, 114b to enable diode emulation of the example switch s1 104a and/or the example switch s2 104b in response to a fault. The state machine 112 and the example diode emulation control circuits 114a, 114b are further described below.

The switch s1 104a and the switch s2 104b of FIG. 1A are transistors structured in a half-bridge formation. For example, as illustrated in FIG. 1A the switches 104a, 104b are gallium nitride (GaN) transistors. However, the example switches 104a, 104b may be any type of switches (e.g., field effect transistors, metal oxide field effect transistors, etc.). The switch s1 104a and the switch s2 104b include a source terminal, a gate terminal, and a drain terminal. In first quadrant mode of the switch s1 104a and the switch s2 104b, when sufficient voltage is applied to the gate terminal of either of the switch s1 104a, or switch s2 104b, the corresponding switch 104a, 104b is enabled (e.g., closed) to allow current to flow from the drain terminal to the source terminal or flow from the source terminal to the drain terminal. When the voltage(s) applied to the gate terminal(s) of the switch s1 104a and the switch s2 104b is insufficient (e.g., lower than a threshold), the corresponding switches 104a, 104b are disabled (e.g., opened) to limit and/or restrict current from flowing from the drain terminal to the source terminal. However, when the current from the inductor 106 is larger than a threshold (e.g., thereby causing the example switch 104a to operate in third-quadrant), disabling the switches 104a, for example, does not limit and/or restrict current from flowing from the source terminal to the drain terminal. For example, when the switch s1 104a and the switch s2 104b are implemented with GaN transistors, either of the switch s1 104a and the switch s2 104b may enter third quadrant mode when the switch s1 104a and the switch s2 104b are disabled and more than a threshold amount of current is flowing from the inductor 106 toward the source of the switch s1 104a and the switch s2 104b. As described above, third quadrant mode of a GaN transistor corresponds to a large voltage drop across the terminals of the switch s1 104a and the switch s2 104b (e.g., a source-to-drain voltage drop), which results in a large power dissipation.

In the illustrated example power stage 100 of FIG. 1A, the drain terminal of the example switch s1 104a is coupled to the diode emulation control circuit 114a and the example output load/capacitor 108, the source terminal is coupled to the example diode emulation control circuit 114a, the drain terminal of the example switch s2 104b, and the inductor 106, and the gate terminal is coupled to the example diode emulation control circuit 114a, and the example driver 103. In the illustrated example power stage 100 of FIG. 1A, the drain terminal of the example switch s1 104a is coupled to the diode emulation control circuit 114a and the example output load/capacitor 108, the source terminal is coupled to the example diode emulation control circuit 114a; the drain terminal of the example switch s2 104b; and the inductor 106, and the gate terminal is coupled to the example diode emulation control circuit 114a and the example driver(s) 103.

The example inductor 106 of FIG. 1A includes a first terminal coupled to an input voltage and/or current source and a second terminal coupled to the source terminal of the example switch 104a and the drain terminal of the example switch 104b. When the inductor 106 is coupled to ground, via the example switch s2 104b, the inductor 106 charges (e.g., builds up a magnetic field). When the inductor 106 is coupled to the example output load/capacitor 108, via the example switch s1 104a, the inductor 106 discharges, causing current to flow toward the example output load/capacitor 108 via the example switch s1 104a.

The example output load/capacitor 108 of FIG. 1A includes one or more components that corresponds to the output stage of the example power stage 100. The example load/capacitor 108 may an output load as part of a server and/or telecom, personal electronics, industrial power supplies, automotive DC/DC chargers, automotive on board chargers, industrial motor drives, etc. In some examples, the output load 108 does not include a capacitor. In such examples, the output load 108 may include other components that may have inherent capacitance.

The example temperature sensors 110a, 110b of FIG. 1A are coupled to the example state machine 112. The temperature sensors 110a, 110b sense temperature on and/or near the respective switches 104a, 104b. For example, the temperature sensor 110a may be located on or near the example switch 104a, on the die itself, within the package, etc. In some examples, the temperature sensors 110a, 110b convert the temperature into a signal representative of the sensed temperature (e.g., a voltage corresponding to a temperature). In some examples, the state machine 112 converts the sensed temperature (or value corresponding to a temperature) and converts the sensed temperature into a voltage or other measurement that may be used to compare against one or more thresholds. Although the example of FIG. 1A illustrates the temperature sensors 110a, 110b coupled to the gate driver circuit 102, the example gate driver circuit 102 may include the example temperature sensors 110a, 110b. Additionally or alternatively, the example temperature sensors 110a, 110b may be coupled to a controller (e.g., the controller that transmits PWM control signals to the example driver(s) 103). In such examples, the controller may determine a fault and transmit a fault signal to the state machine 112 to initiate diode emulation mode.

The example state machine 112 of FIG. 1A is located in the example gate driver circuit 102. The example state machine 112 determines when a fault occurs (e.g., directly from the temperature sensor(s) 110a, 110b and/or indirectly based on a fault signal from a controller) and enables the diode emulation control circuit 114a, 114b that corresponds to a fault. For example the example state machine 112 may obtain a signal corresponding to a temperature from the example temperature sensors 110a, 110b and compares the signal representative of the temperature to one or more thresholds. The one or more thresholds correspond to, for example, a maximum temperature before a shutdown occurs. For example, for an over-temperature fault, the state machine 112 compares the temperature sensed by the temperature sensor 110a to an over-temperature threshold and triggers an over-temperature protocol when the temperature is above the shutdown threshold. Once the state machine 112 determines that the fault condition has been met, the state machine 112 initiates the shutdown protocol by transmitting a control signal to one or more of the example diode emulation control circuits 114a, 114b to enable diode emulation of one or more of the example switch s1 104a and the example switch s2 104b. For example, the state machine 112 may instruct the example driver(s) 103 to halt transmission of the control signals to the example switches 104a, 104b. As described above, diode emulation mode corresponds to controlling the example switch s1 104a, for example, to enable (e.g., turn on) the switch 104a to allow current to flow in a first direction (e.g., when current is flowing from the source to the drain the switch 104a) and disable (e.g., turn off) the switch 104a to prevent current from flowing in a second opposite direction (e.g., when current is flowing from the drain to the source of the switch 104a). When a fault is triggered based on the temperature sensor 110a corresponding to the example switch s1 104a, the example state machine 112 enables the diode emulation control circuit 114a. When a fault is triggered based on the temperature sensor 110b corresponding to the example switch s2 104b, the example state machine 112 enables the diode emulation control circuit 114b. The state machine 112 may be implemented using hardware such as a logic circuit, software, or any combination of hardware and/or software.

The example diode emulation control circuits 114a, 114b of FIG. 1A control the example switch s1 104a and the example switch s2 104b to cause the switch s1 104a and the switch s2 104b to emulate a diode. For example, when the state machine 112 enables the diode emulation control circuit 114a (e.g., in response to a fault), the diode emulation control circuit 114a applies a control signal to the gate of the example switch s1 104a to (A) enable (e.g., partially or fully turn on) the switch s1 104a when there is current flowing from the inductor 106 toward the source of the switch s1 104a and (B) turn off the switch s1 104a when there is current flowing from the output load/capacitor 108 toward the drain of the switch s1 104a. In this manner, current in a first direction (e.g., a reverse current from source to drain) will be conducted by the GaN switch 104a, whereas current in a second direction (e.g., a current from drain to source) will be blocked by the GaN switch 104a in a manner similar to the operation of a diode in reverse bias. By enabling the switch 104a to allow current to flow from the source to the drain of the example switch s1 104a during a fault, the example diode emulation control circuit 114a prevents third quadrant mode of the switch s1 104a. Advantageously, the state machine 112 and the diode emulation control circuit 114 is operable to reduce the voltage drop across the GaN switch 104 and thus reduce the power dissipation of the GaN switch s1 104a during an over-temperature protocol. By disabling the switch 104a to block current from flowing from the drain to the source of the example switch s1 104a during a fault, the example diode emulation control circuit 114a prevents the example load/capacitor 108 from discharging and/or providing current to the example inductor 106. In this manner, the state machine 112 and the diode emulation control circuit 114 is operable to prevent the example inductor 106 from charging during a fault. Advantageously, the state machine 112 and the diode emulation control circuit 114 reduce the charge of the inductor 106 during a fault to dissipate current and thus further reduce the power dissipation of the GaN switch s1 104a during an over-temperature fault protocol.

In the illustrated example of the power stage 100 of FIG. 1A, the diode emulation control circuits 114a, 114b determine the direction of current flow (e.g., current direction) by measuring a voltage drop across the respective example switch s1 104a and the example switch s2 104b (e.g., by comparing the voltage at the source and drain of the switch s1 104a and the switch s2 104b). For example, if the voltage drop is positive, the current is flowing in a first direction and if the voltage drop is negative, the current is flowing in a second opposite direction). However, the example diode emulation control circuit 114a can determine the direction of the current using any technique. For example, the example diode emulation control circuit 114a may utilize a current sensor to obtain a current measurement to determine the current direction, as further described below in conjunction with FIG. 1B. In some examples, either of the diode emulation control circuits 114a, 114b may be implemented by two diode emulation control circuits (e.g., one to determine the drain-to-source voltage and one to determine the source-to-drain voltage). In some examples, the diode emulation control circuits 114a, 114b may be implemented by one diode emulation control circuit. For example, a voltage and/or current sensor(s) for the first switch 104a may be coupled to a voltage and/or current sensor(s) for the second switch 104b via one or more switches and/or one or more multiplexers. In this manner, the one or more switches and or one or more multiplexers may be controlled to couple either the first switch 104a or the second switch 104b to the example diode emulation control circuit 114a based on where the fault occurred. The diode emulation control circuit 114a, 114b may be implemented using hardware, software, or any combination of hardware and/or software. In some examples, the diode emulation control circuit 114a, 114b can be implemented by and/or in the state machine 112. Additionally or alternatively, the diode emulation control circuits 114a, 114b could be implemented by an additional state machine or processor. A hardware implementation of the example diode emulation control circuits 114a, 114b is further described below in conjunction with FIG. 2A.

Figure 1B:
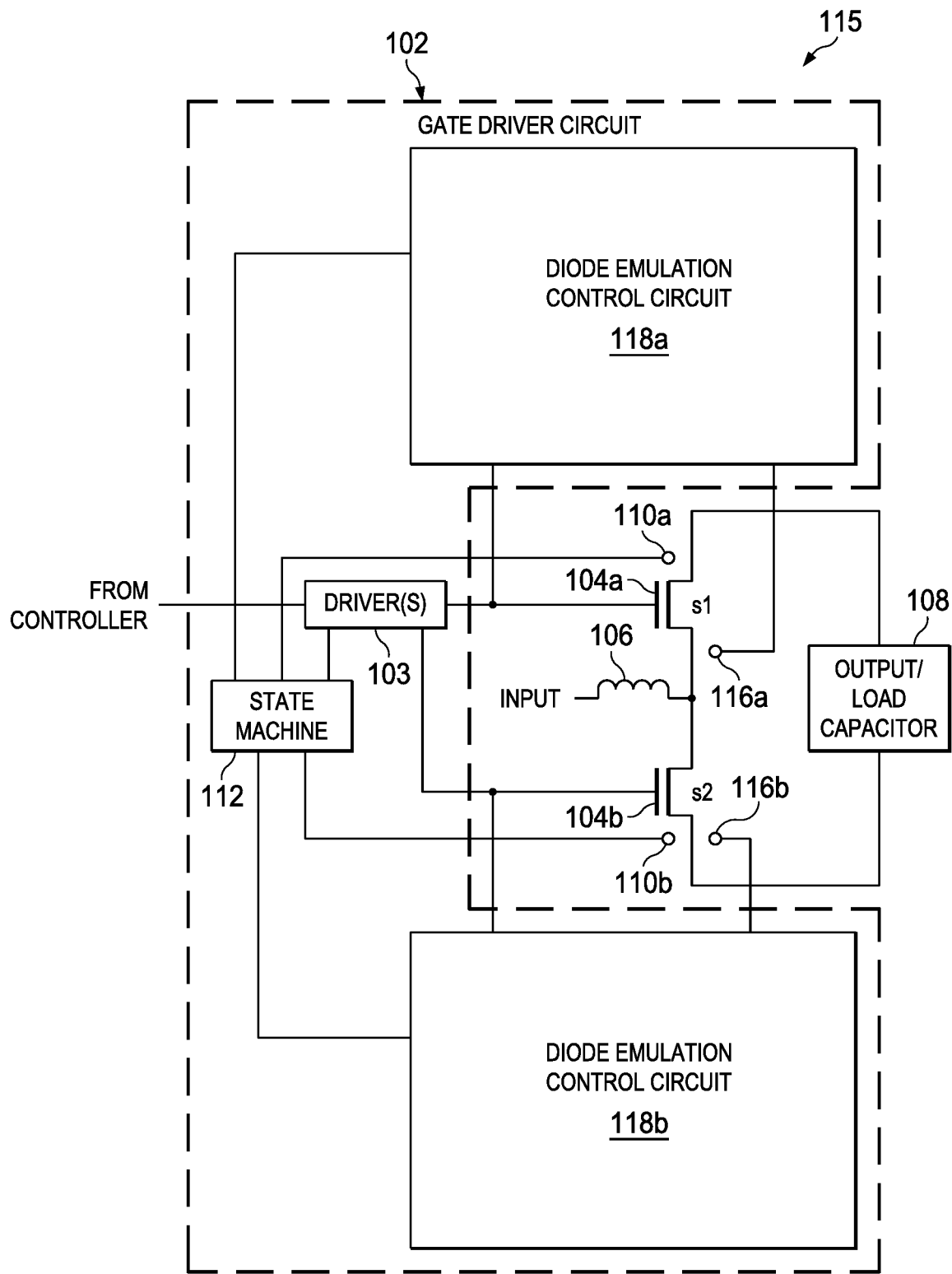
FIG. 1B illustrates an alternative example switching power converter constructed in accordance with teaching disclosed herein.

FIG. 1B illustrates an alternative example power stage 115 (e.g., a half-bridge switching power converter) to converter an input voltage (Vin) and/or input current to a desired output voltage. The power stage 115 includes the example gate driver circuit 102, the example driver(s) 103, the first example switch 104a (e.g., example switch s1 104a), the second example switch 104b (e.g., example switch s2 104b), the example inductor 106, the example temperature sensors 110a, 110b, and the example state machine 112 of FIG. 1A. The power stage 115 further includes example current sensors 116a, 116b and example diode emulation control circuits 118a, 118b. The example power stage 115 is connected the example output load/capacitor 108. Components of the example power stage 100 may be implemented into one or more dies. For example, silicon based components (e.g., the example gate driver circuit 102, the example temperature sensors 110a, 110b, the example inductor 106, and/or the example current sensors 116a, 116b) may be implemented in a first die and the GaN components (e.g., the example switches 104a, 104b) may be implemented in a second die. In such examples, the two dies may be integrated into a signal package, thereby corresponding to the example power stage 115.

The example current sensors 116a, 116b of FIG. 1B sense the current measured from the source of the respective switches 104a, 104b. For example, the current sensor 116a measures the current from the example inductor 106 flowing to the source of the example switch 104a and the current sensor 116b measures the current from ground toward the source of the example switch 104b. Additionally or alternatively, the example current sensors 116a, 116b and/or additional current sensors may be located at the drain of the respective switches 104a, 104b. The example current sensors 116a, 116b convert a sensed current to a voltage that is transmitted to the respective example diode emulation control circuits 118a-118b. The example diode emulation control circuits 118a, 118b, when enabled (e.g., based on an enable control signal from the example state machine 112 when a thermal fault occurs) determine whether the current (e.g., the drain-to-source current) is a positive current (e.g., flowing from the drain to the source) or a reverse current (e.g., flowing from the source to the drain) and enables and/or disables the respective example switches 104a, 104b based on the direction of the current (e.g., whether the sensed drain-to-source current is flowing in a first (positive) direction or a second (reverse) direction). For example, during a thermal fault, the example diode emulation control circuit 118a enables the switch 104a when the current sensed by the current sensor 116a corresponds to a first direction (e.g., flowing from the source of the switch 104a to the drain of the switch 104a) and disables the switch 104a when the current sensed by the current sensor 116a corresponds to a second direction opposite (e.g., reverse) the first direction (e.g., flowing from the drain of the switch 104a to the source of the switch 104a).

Figure 1C:
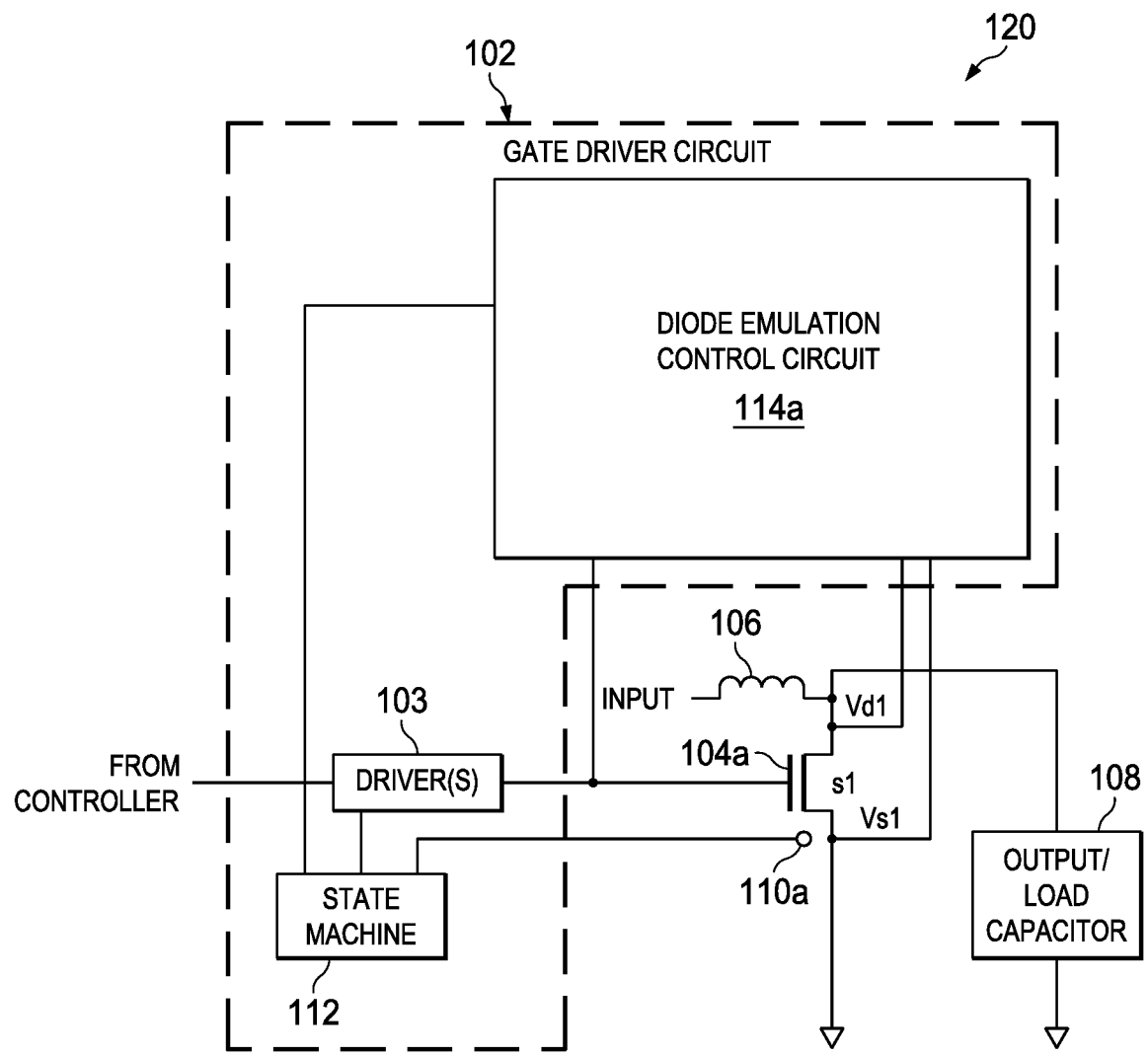
FIG. 1C illustrates an example single channel power converter constructed in accordance with teaching disclosed herein.

FIG. 1C illustrates the example diode emulation control circuit 114a of FIG. 1A implemented in an alternative example power stage 120 (e.g., a single channel power converter) to converter an input voltage (Vin) and/or input current to a desired output voltage. The power stage 120 includes the example gate driver circuit 102, the example driver(s) 103, the first example switch 104a (e.g., example switch s1 104a), the example inductor 106, the example temperature sensor 110a, the example state machine 112, and the example diode emulation control circuit 114a of FIG. 1A. Although the example power stage 120 of FIG. 1C includes the example diode emulation control circuit 114a, the example power stage 120 may additionally or alternatively include the example current sensor 116a and the example diode emulation control circuit 118a of FIG. 1B to enable diode emulation mode of the example switch 104a. The example power stage 120 is connected the example output load/capacitor 108. Components of the example power stage 100 may be implemented into one or more dies. For example, silicon based components (e.g., the example gate driver circuit 102, the example temperature sensor 110a, and/or the example inductor 106) may be implemented in a first die and the GaN component (e.g., the example switch 104a) may be implemented in a second die. In such examples, the two dies may be integrated into a signal package, thereby corresponding to the example power stage 120.

Figure 1D:
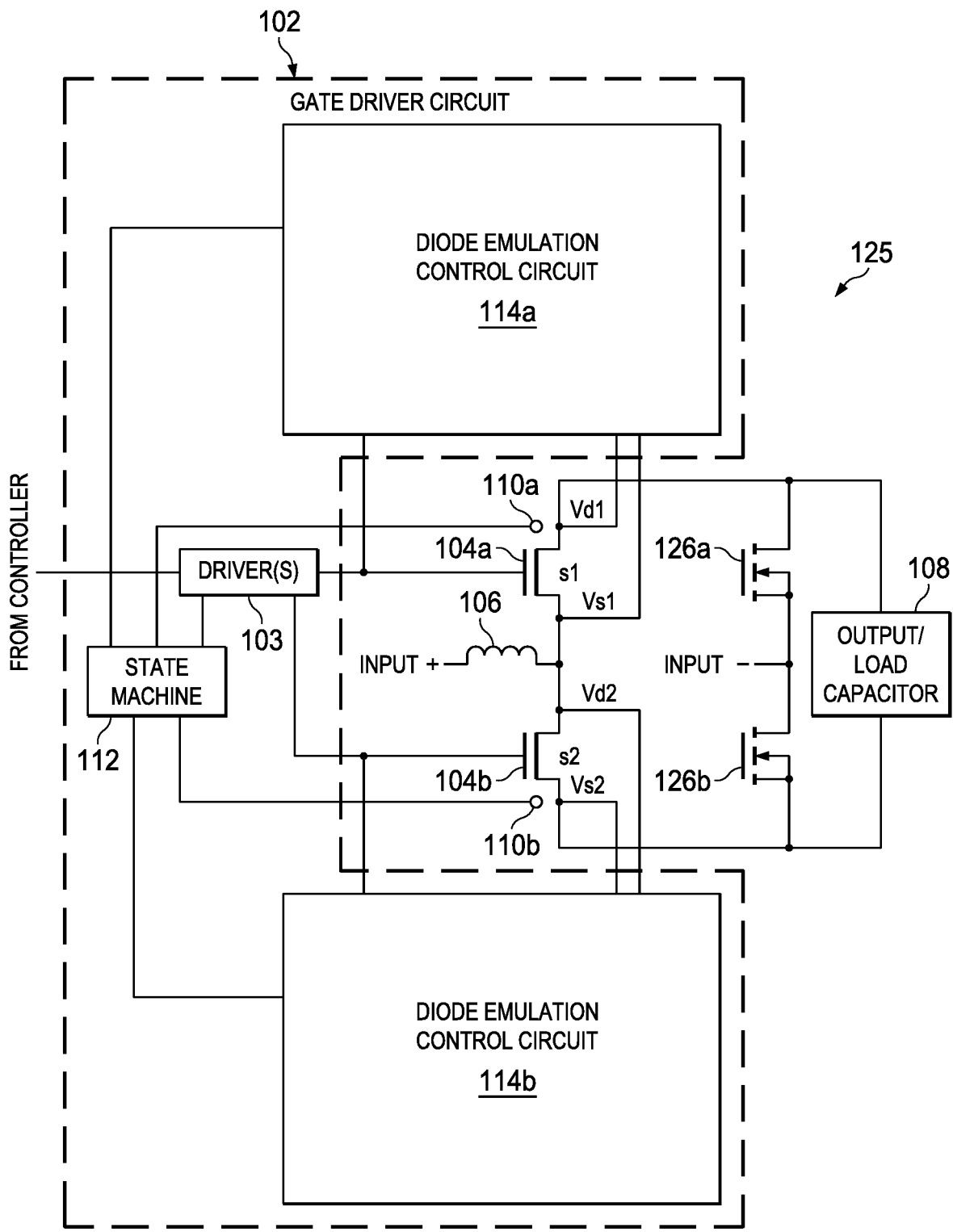
FIG. 1D illustrates an example totem pole converter constructed in accordance with teaching disclosed herein.

FIG. 1D illustrates the example diode emulation control circuits 114a, 114b of FIG. 1A implemented in an alternative example power stage 125 (e.g., a totem pole-based power converter) to converter an input voltage (Vin) and/or input current to a desired output voltage. The power stage 125 includes the example gate driver circuit 102, the example driver(s) 103, the first example switch 104a (e.g., example switch s1 104a), the second example switch 104b (e.g., example switch s2 104b), the example inductor 106, the example temperature sensors 110a, 110b, and the example state machine 112 of FIG. 1A. The example power stage 125 further includes the example metal oxide semiconductor field effect transistors (MOSFETs) 126a, 126b. The example driver(s) 103 of the example gate driver circuit 102 can control the MOSFETs 126a, 126b (e.g., enabling and/or disabling the MOSFETs 126a, 126b by applying one or more voltages to the gates of the MOSFETs 126a, 126b) to provide a path for current to flow between the inputs (e.g., input+ and input−). For example, the driver(s) 103 may control the MOSFETs 126a, 126b (e.g., toggle) so that one in enabled and the other is disabled for each half AC cycle. In some examples, additional MOSFETs may be added to the totem pole structure. Although the example power stage 125 of FIG. 1D includes the example diode emulation control circuits 114a, 114b, the example power stage 125 may additionally or alternatively include one or more of the example current sensor(s) 116a, 116b and the example diode emulation control circuit(s) 118a, 118b of FIG. 1B to enable diode emulation mode of the example switch(es) 104a, 104b. The example power stage 125 is connected the example output load/capacitor 108. Components of the example power stage 125 may be implemented into one or more dies. For example, silicon based components (e.g., the example gate driver circuit 102, the example temperature sensors 110a, 110b, the example inductor 106, and/or the example switches 126a, 126b) may be implemented in a first die and the GaN components (e.g., the example switches 104a, 104b) may be implemented in a second die. In such examples, the two dies may be integrated into a signal package, thereby corresponding to the example power stage 125.

Although the example power stages 100, 115, 120, 125 of FIGS. 1A-D illustrate example diode emulation control circuits 114a, 114b, 118a, 118b in various configurations, any of the example diode emulation control circuits 114a, 114b, 118a, 118b may be structured to control any of the switches of any type power converter and/or any circuit including such switches. For example, the diode emulation control circuits 114a, 114b, 118a, and/or 118b may be used in conjunction with any one of the example power stages 100, 115, 120, 125, a zero-voltage-switching auxiliary cell, a three-phase inverter, a full-bridge power stage, an LCC converter, a phase-shifted full-bridge, a dual active bridge converter, etc. used in conjunction with a PFC and/or DC/DC stage of a server and/or telecom, personal electronics, industrial power supplies, automotive DC/DC and on board chargers, industrial motor drives, etc.

Figure 2A:
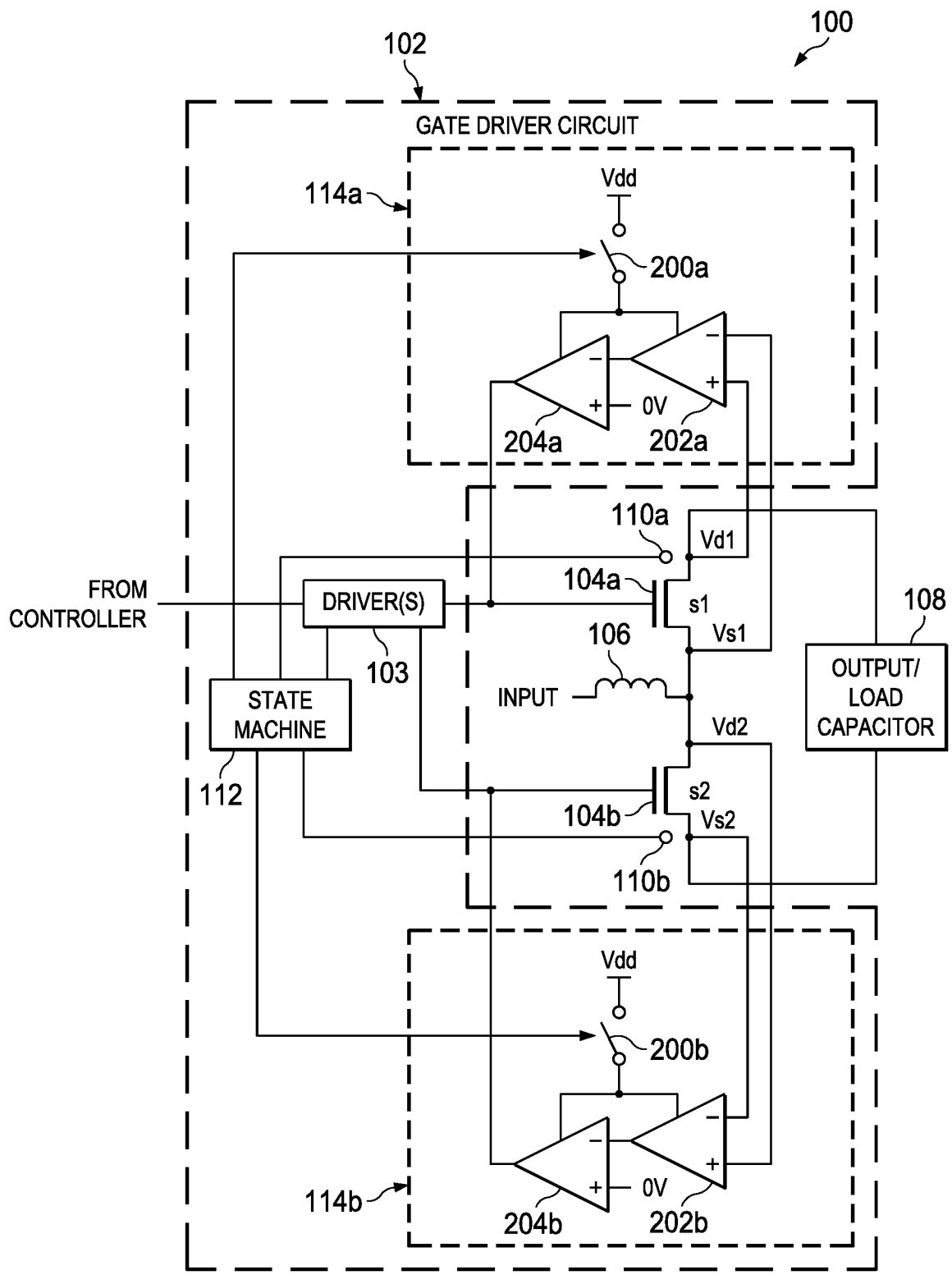
FIG. 2A illustrates an example power converter showing an example circuit implementation of a diode emulation control circuit of FIG. 1A, 1C, 1D.

FIG. 2A illustrates a hardware implementation of the example diode emulation control circuits 114a, 114b of FIGS. 1A, 1C, and 1D. The example power stage 100 of FIG. 2A includes the example gate driver circuit 102, the example driver(s) 103, the example switch s1 104a and the example switch s2 104b, the example inductor 106, the example output load/capacitor 108, the example temperature sensors 110a, 110b, the example state machine 112, and the example diode emulation control circuits 114a, 114b of FIGS. 1A, 1C, and 1D. The example diode emulation control circuits 114a, 114b of FIGS. 1A, 1C, and 1D include example switches 200a, 200b, example differential amplifiers 202a, 202b and example comparators 204a, 204b.

The example switches 200a, 200b of FIG. 2A, when enabled (e.g., turned on, closed, etc.) provide a voltage source, Vdd, to the example differential amplifiers 202a, 202b and the example comparators 204a, 204b to enable the diode emulation control circuit 114a. The example switches 200a, 200b, when disabled (e.g., turned off, opened, etc.), cut off Vdd from the example differential amplifiers 202a, 202b and the example comparators 204a, 204b to disable the diode emulation control circuit 114a. The example state machine 112 transmits a control signal(s) to one or more the example switches 200a, 200b to enable one or more of the example switches 200a, 200b when a fault occurs and disable the one or more of the example switches 200a, 200b when a fault is not occurring.

The example diode emulation control circuits 114a, 114b of FIG. 2A determine the direction of current by measuring a voltage drop across the respective switches 104a, 104b. However, the example diode emulation control circuits 114a, 114b may determine the direction of current using other techniques and/or components. For example, the diode emulation control circuits 114a, 114b may be coupled to a current sensor (e.g., the example current sensors 116a, 116b) that measures and/or obtains the current through the example switches 104a, 104b and/or the inductor 106, as further described below in conjunction with FIG. 2B.

In the illustrated example of FIG. 2A, the negative terminal of the example differential amplifier 202a is coupled to the source of the example switch 104a and the positive terminal of the differential amplifier 202a is coupled to the drain of the example switch 104a. The example differential amplifier 202a compares the drain voltage (Vd1) of the example switch 104a to the source voltage (Vs1) of the switch 104a and outputs a voltage based on the result. For example, the differential amplifier 202a computes the difference between Vs1 and Vd1 and outputs the difference multiplied by an amplifying factor. In this manner, if the voltage drop from the source to the drain is positive (e.g., corresponding to current flow from the source to the drain of the example switch 104a), the output of the example differential amplifier 202a will be positive and if the voltage drop from the source to the drain is negative (e.g., corresponding to a current from the drain to the source of the switch 104a), the output of the differential amplifier 202a will be negative. The output of the example differential amplifier 202a is coupled to the negative terminal of the example comparator 204a.

The example comparators 204a, 204b of FIG. 2A compare a voltage at a first terminal (e.g., a positive terminal) to a voltage at a second terminal (e.g., the negative terminal). If the voltage at the positive terminal is higher than the voltage at the negative terminal, the comparators 204a, 204b will output a first voltage (e.g., a high voltage) and if the positive terminal is lower than the voltage at the negative terminal, the comparators 204a, 204b will output a second voltage (e.g., a low voltage). In the example diode emulation control circuits 114a, 114b, the negative terminal is coupled to the output of the respective example differential amplifiers 202a, 202b and the positive terminal is coupled to a 0V (volts) reference (e.g., ground). Accordingly, if the output of the example differential amplifier 202a is positive (e.g., corresponding to a current flowing from the drain to the source of the example switch s1 104a), the comparator 204a will output a low voltage (e.g., the voltage positive terminal (0V) is less than the voltage at the negative terminal (a positive voltage)). Because the output of the comparator 204a is coupled to the gate of the example switch s1 104a, the low voltage output of the comparator 204a will cause the example switch s1 104a to disable, thereby blocking current from flowing from the drain to the source of the switch s1 104a (e.g., preventing the inductor 106 from charging). If the output of the example differential amplifier 202a is negative (e.g., corresponding to a current flowing from the source to the drain of the example switch s1 104a), the comparator 204a will output a high voltage (e.g., the voltage positive terminal (0V) is greater than the voltage at the negative terminal (a negative voltage)). Because the output of the comparator 204a is coupled to the gate of the example switch s1 104a, the high voltage output of the comparator 204a will cause the example switch s1 104a to enable, thereby allowing current to flow from the source to the drain of the switch s1 104a (e.g., preventing third quadrant mode of the switch s1 104a). Although FIG. 2A illustrates an example circuit implementing the example diode emulation control circuits 114a, 114b of FIGS. 1A, 1C, and 1D to enable the example switch(es) 104a, 104b when the current corresponds to a first direction and disable the example switch(es) 104a, 104b when the current corresponds to a second direction, there may be additional and/or alternative circuits to control the example switch(es) 104a, 104b in a similar and/or identical manner.

Figure 2B:
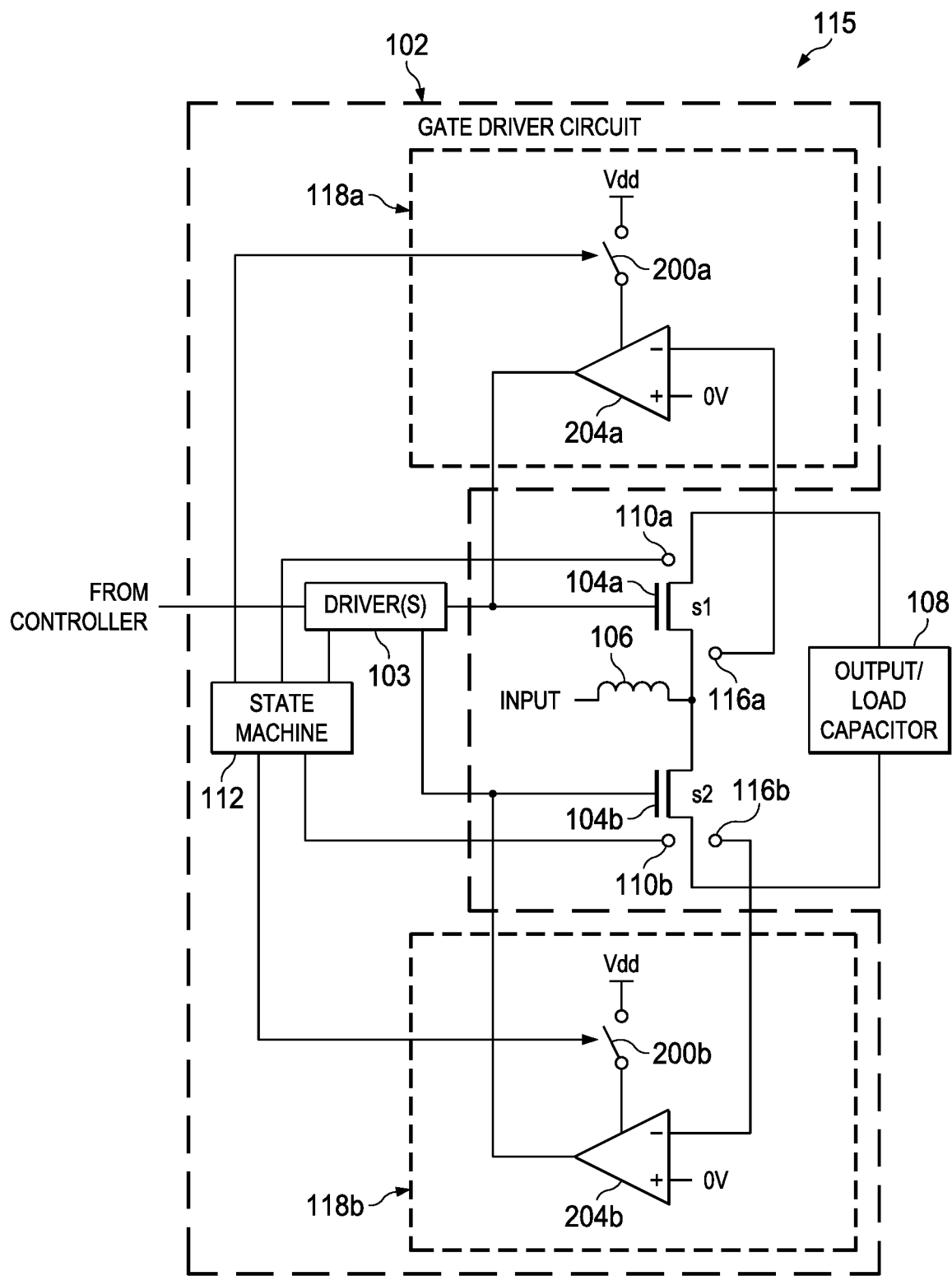
FIG. 2B illustrates an example power converter showing an example circuit implementation of a diode emulation control circuit of FIG. 1B.

FIG. 2B illustrates a hardware implementation of the example diode emulation control circuits 118a, 118b of FIG. 1B. The example power stage 100 of FIG. 2B includes the example gate driver circuit 102, the example driver(s) 103, the example switch s1 104a and the example switch s2 104b, the example inductor 106, the example output load/capacitor 108, the example temperature sensors 110a, 110b, the example state machine 112, and the example diode emulation control circuits 118a, 118b of FIG. 1B. The example diode emulation control circuits 118a, 118b include the example switches 200a, 200b, and the example comparators 204a, 204b of FIG. 2A.

The example switches 200a, 200b of FIG. 2B, when enabled (e.g., turned on, closed, etc.) provide a voltage source, Vdd, to the example differential amplifiers 202a, 202b and the example comparators 204a, 204b to enable the diode emulation control circuit 118a. The example switches 200a, 200b, when disabled (e.g., turned off, opened, etc.), cut off Vdd from the example differential amplifiers 202a, 202b and the example comparators 204a, 204b to disable the diode emulation control circuit 118a. The example state machine 112 transmits a control signal(s) to one or more the example switches 200a, 200b to enable one or more of the example switches 200a, 200b when a fault occurs and disable the one or more of the example switches 200a, 200b when a fault is not occurring.

The example diode emulation control circuits 118a, 184b of FIG. 2B determine the direction of current by comparing the current sensed by the example current sensors 116a, 116b to a voltage representative of 0 current. However, the example diode emulation control circuits 118a, 118b may determine the direction of current using other techniques and/or components.

The example comparators 204a, 204b of FIG. 2B compare a 0 voltage corresponding to 0 current at a first terminal (e.g., a positive terminal) to a voltage representative of the current sensed by the example current sensor 116a at a second terminal (e.g., the negative terminal). If the voltage at the positive terminal is higher than the voltage at the negative terminal, the comparators 204a, 204b will output a first voltage (e.g., a high voltage) and if the positive terminal is lower than the voltage at the negative terminal, the comparators 204a, 204b will output a second voltage (e.g., a low voltage). In the example diode emulation control circuits 118a, 118b, the negative terminal is coupled to the output of the respective example differential amplifiers 202a, 202b and the positive terminal is coupled to a 0V (volts) reference (e.g., ground). Accordingly, if the drain-to-source current is positive (e.g., corresponding to a current flowing from the drain to the source of the example switch s1 104a), the comparator 204a will output a low voltage (e.g., the voltage positive terminal (0V) is less than the voltage at the negative terminal (a positive voltage)). Because the output of the comparator 204a is coupled to the gate of the example switch s1 104a, the low voltage output of the comparator 204a will cause the example switch s1 104a to disable, thereby blocking current from flowing from the drain to the source of the switch s1 104a (e.g., preventing the inductor 106 from charging). If the drain-to-source current is negative and/or reverse (e.g., corresponding to a current flowing from the source to the drain of the example switch s1 104a), the comparator 204a will output a high voltage (e.g., the voltage positive terminal (0V) is greater than the voltage at the negative terminal (a negative voltage)). Because the output of the comparator 204a is coupled to the gate of the example switch s1 104a, the high voltage output of the comparator 204a will cause the example switch s1 104a to enable, thereby allowing current to flow from the source to the drain of the switch s1 104a (e.g., preventing third quadrant mode of the switch s1 104a). Although FIG. 2A illustrates an example circuit implementing the example diode emulation control circuits 118a, 118b of FIG. 1B to enable the example switch(es) 104a, 104b when the current corresponds to a first direction and disable the example switch(es) 104a, 104b when the current corresponds to a second direction, there may be additional and/or alternative circuits to control the example switch(es) 104a, 104b in a similar and/or identical manner.

Figure 3:
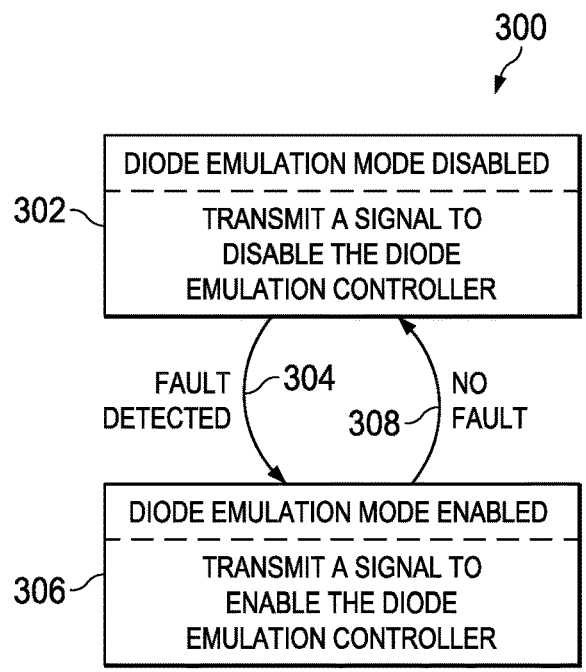
FIG. 3 illustrates a state diagram representative of example operating states in which a state machine of FIGS. 1A-D and/or 2A-B may operate.

FIG. 3 is an example state diagram 300 representative of example operating states in which the example state machine 112 of FIGS. 1A-D and/or 2A-B and/or may operate. The example state diagram 300 includes an example diode emulation mode disabled state 302, an example fault detected condition 304, an example diode emulation mode enabled state 306, and an example no fault detected condition 308.

In the example diode emulation mode enabled state 302 of FIG. 3, the example state machine 112 transmits a signal (e.g., a low voltage) to the respective example diode emulation control circuit 114a, 114b to disable the respective diode emulation control circuit 114a, 114b. For example, the state machine 112 transmits a low voltage to disable the respective example switches 200a, 200b. When the example state machine 112 detects the fault detection fault condition 304 (e.g., a sensed temperature has increased to and/or beyond a threshold), the state machine 112 enters the example diode emulation mode enabled state 306 for the switch corresponding to the fault.

In the diode emulation mode disabled state 306 of FIG. 3, the example state machine 112 transmits a signal (e.g., a high voltage) to the one of the example diode emulation control circuit 114a, 114b to enable the diode emulation control circuit 114a, 114b connected to the switch corresponding to the fault. For example, the state machine 112 transmits a high voltage to enable the corresponding example switch (e.g., one of the example switches 200a, 200b). When the example state machine 112 detects the no fault detected condition 308 (e.g., a sensed temperature has decrease to and/or below the threshold), the state machine 112 returns to the example diode emulation mode disabled state 302 for the switch corresponding to the fault.

Figure 4:
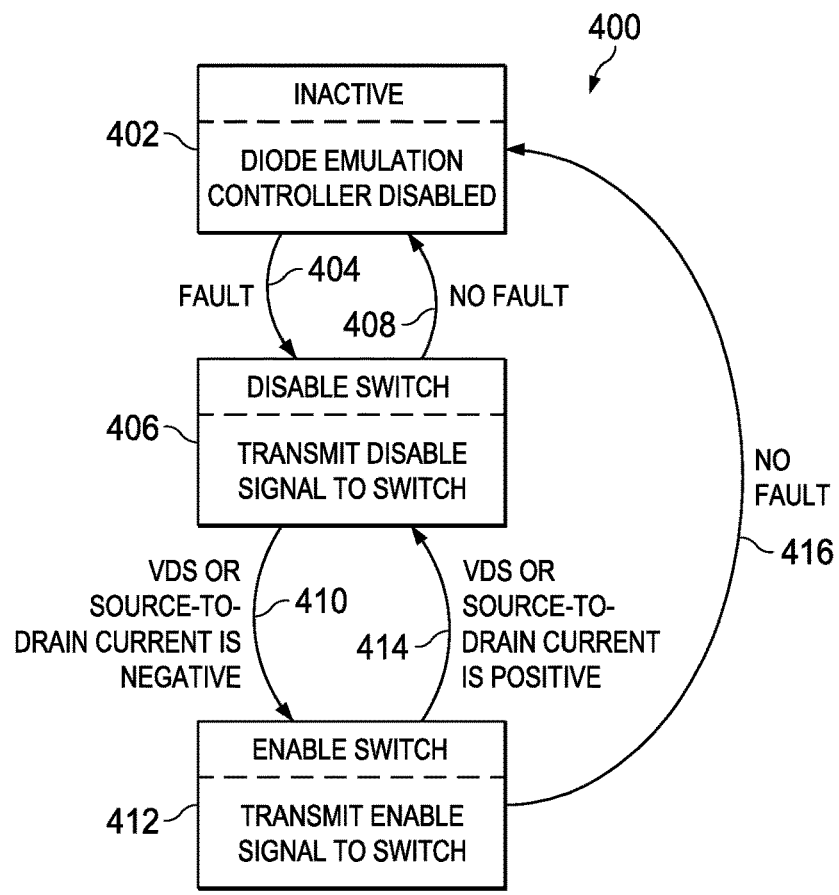
FIG. 4 illustrates a state diagram representative of example operating states in which the diode emulation control circuit of FIGS. 1A-D and/or 2A-B may operate.

FIG. 4 is an example state diagram 400 representative of example operating states in which the example diode emulation control circuit 114a or the example diode emulation control circuit 114b of FIGS. 1A-D and/or 2A-B may operate. The example state diagram 400 includes an example inactive state 402, an example fault condition 404, an disable switch state 406, an example no fault conditions 408, 416, an example drain-to-source voltage (Vds) or drain-to-source current negative condition 410, an example enable (e.g., a full enable or a partial enable) switch state 412, and an example Vds or drain-to-source current positive condition 414. Although the example state diagram 400 is described in conjunction with the diode emulation control circuit 114a, the example state diagram 400 may be used to describe the example diode emulation control circuit 114b.

In the example inactive state 402, the example diode emulation control circuit 114a is inactive (e.g., not operating). The example inactive state 402 may be based on a control signal from the example state machine 112 of FIGS. 1A-D and/or 2A-B. For example, if the state machine 112 transmits a low voltage to the example switch 200a, the switch 200a is disabled and the example diode emulation control circuit 114a is disabled. In response to the fault condition 404, the example state machine 112 transmits a high voltage to the example switch 200a, causing the switch 200a to enable (e.g., fully or partially), thereby enabling the example diode emulation control circuit 114a. In the example disable switch state 406, the diode emulation control circuit 114a transmits a disable signal (e.g., a low voltage) to the gate of the example switch 104a to disable the example switch 104a. In response to the no fault condition 408, the example state machine 112 transmits a low voltage to the example switch 200a, causing the switch 200a to disable, thereby disabling the example diode emulation control circuit 114a to return to the example inactive state 402.

In response to the Vds or drain-to-source current of the switch 104a being negative condition 410 (e.g., using a voltage and/or current sensor), the example diode emulation control circuit 114a enters the enable switch state 412. In the example enable switch state 412, the example diode emulation control circuit 114a transmits an enable signal (e.g., a high voltage) to the gate of the example switch 104a to enable the example switch 104a (e.g., to prevent third quadrant mode of the example switch 104a and reduce power dissipation, thereby reducing temperature). In response to the Vds or drain-to-source current of the switch 104a being positive condition 414 (e.g., using the voltage and/or current sensor), the example diode emulation control circuit 114a returns to the disable switch state 406. Additionally, in response to the no fault condition 416, the example state machine 112 transmits a low voltage to the example switch 200a, causing the switch 200a to disable, thereby disabling the example diode emulation control circuit 114a to return to the example inactive state 402.

While an example manner of implementing the gate driver circuit 102 of FIGS. 1A-D is illustrated in FIGS. 1A-D and/or 2A-B, one or more of the elements, processes and/or devices illustrated in FIGS. 1A-D and/or 2A-B may be combined, divided, re-arranged, omitted, eliminated and/or implemented in any other way. Further, the example driver(s) 103, the example state machine 112, the example diode emulation control circuits 114a, and/or, more generally, the example gate driver circuit 102 of FIGS. 1A-D and/or 2A-B may be implemented by hardware, software, firmware and/or any combination of hardware, software and/or firmware. Thus, for example, any of the example driver(s) 103, the example state machine 112, the example diode emulation control circuits 114a, and/or, more generally, the example gate driver circuit 102 of FIGS. 1A-D and/or 2A-B could be implemented by one or more analog or digital circuit(s), logic circuits, programmable processor(s), programmable controller(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example driver(s) 103, the example state machine 112, the example diode emulation control circuits 114a, and/or, more generally, the example gate driver circuit 102 of FIGS. 1A-D and/or 2A-B is/are hereby expressly defined to include a non-transitory computer readable storage device or storage disk such as a memory, a digital versatile disk (DVD), a compact disk (CD), a Blu-ray disk, etc. including the software and/or firmware. Further still, the example gate driver circuit 102 of FIGS. 1A-D and/or 2A-B may include one or more elements, processes and/or devices in addition to, or instead of, those illustrated in FIG. 4, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 5:
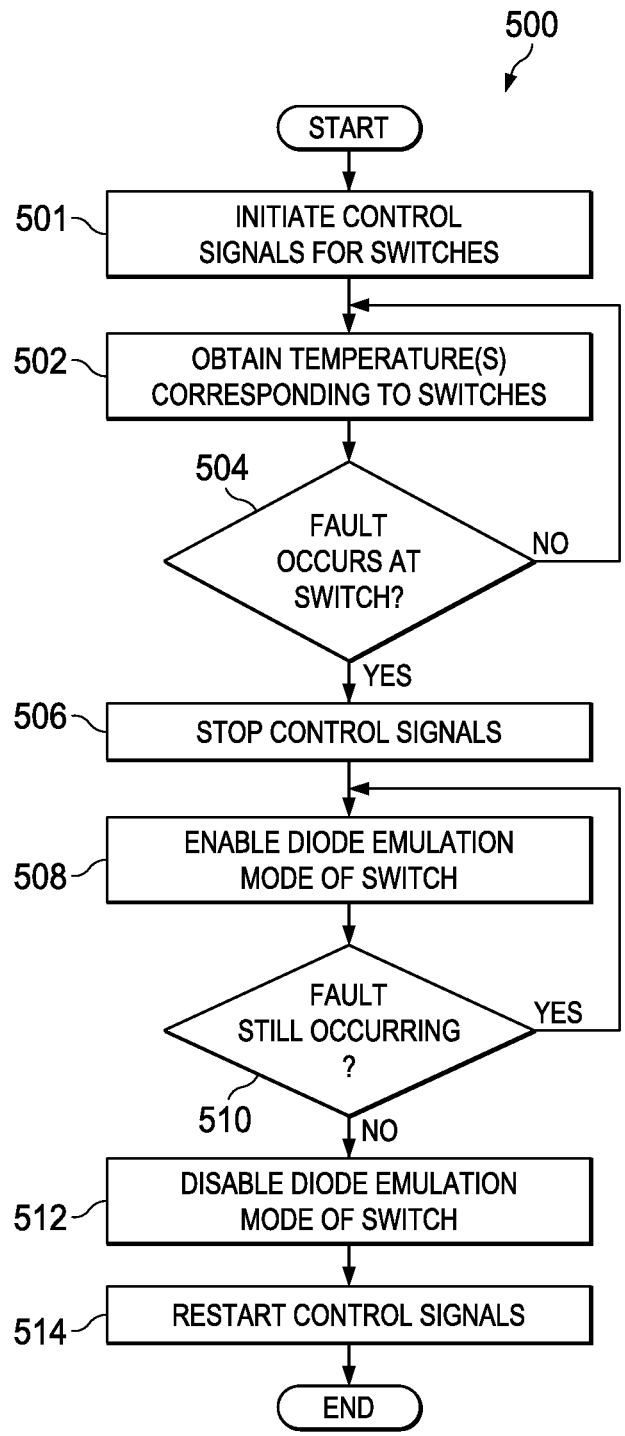
FIG. 5 is a flowchart representative of example machine readable instructions that may be executed and/or hardware configurations to implement the example state diagram of FIGS. 1A-D and/or 2A-B.
Figure 6A:
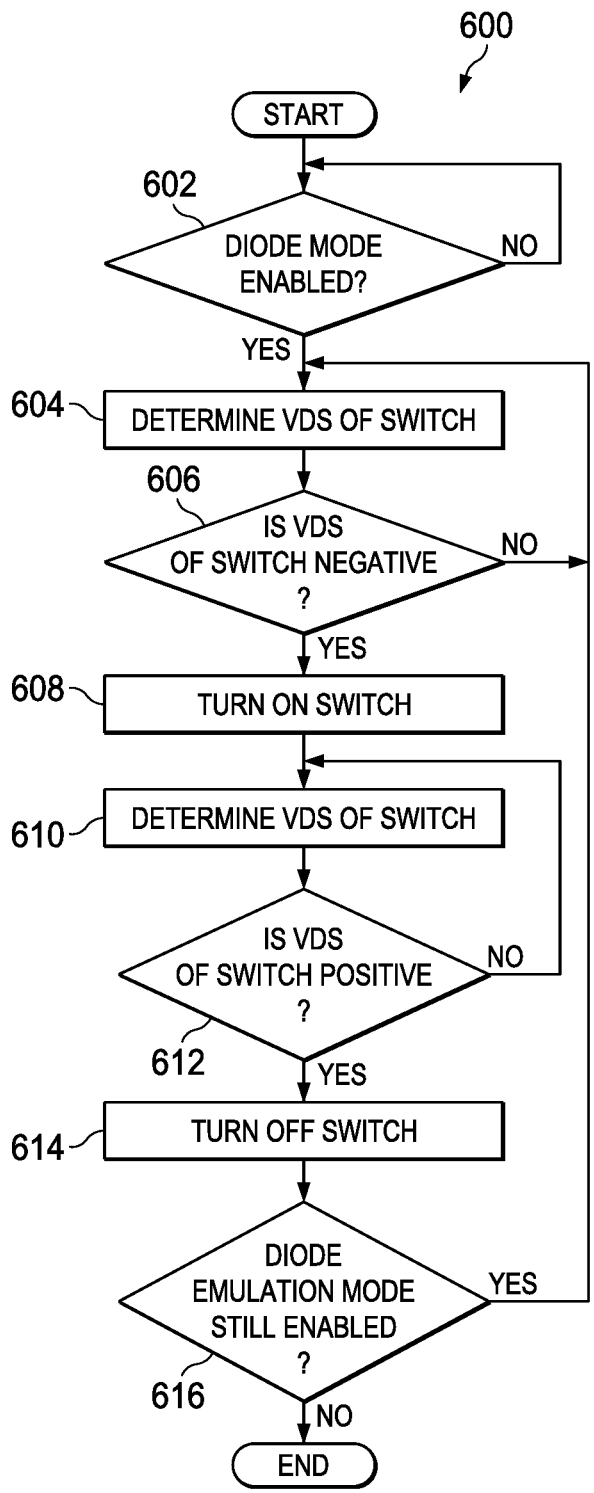
FIGS. 6A-B are flowcharts representative of example machine readable instructions that may be executed and/or hardware configurations to implement the example diode emulation control circuit of FIGS. 1A-D and/or 2B.

Flowcharts representative of example hardware logic, machine readable instructions, hardware implemented state machines, and/or any combination thereof for implementing the gate driver circuit 102 of FIGS. 1A-D and/or 2A-B are shown in FIGS. 5, 6A, and/or 6B. The machine readable instructions may be an executable program or portion of an executable program or portion(s) of an executable program for execution by a computer processor such as the controller (e.g., the example gate driver circuit 102, the example driver(s) 103, the example state machine 112, and/or the example diode emulation control circuits 114a) discussed above in connection with FIGS. 1A-D and/or 2A-B. The program may be embodied in software stored on a non-transitory computer readable storage medium such as a CD-ROM, a floppy disk, a hard drive, a DVD, a Blu-ray disk, or a memory associated with the controller (e.g., the example gate driver circuit 102, the example driver(s) 103, the example state machine 112, and/or the example diode emulation control circuits 114a), but the entire program and/or parts thereof could alternatively be executed by a device other than the controller (e.g., the example gate driver circuit 102, the example driver(s) 103, the example state machine 112, and/or the example diode emulation control circuits 114a) and/or embodied in firmware or dedicated hardware. Further, although the example program is described with reference to the flowchart illustrated in FIG. 8, many other methods of implementing the example gate driver circuit 102, the example state machine 112, and/or the example diode emulation control circuits 114a may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, etc. in order to make them directly readable and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein. In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

As mentioned above, the example processes of FIGS. 5, 6A, and/or 6B may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

FIG. 5 is an example flowchart 500 representative of example machine readable instructions that may be executed by and/or hardware configurations to implement the example gate driver circuit 102 (FIGS. 1A-D and/or 2A-B) to enable and/or disable one or more of the example diode emulation control circuits 114a, 114b in response to a fault. Although the flowchart 500 of FIG. 5 is described in conjunction with the example gate driver circuit 102 of FIG. 1A-D, other type(s) of half-bridge controller(s) and/or other type(s) of processor(s) may be utilized instead.

At block 501, the example driver(s) 103 initiate(s) the control signals for the example switches 104a, 104b based on instructions from a controller. For example, the driver(s) 103 may determine and/or may be preprogrammed in conjunction with a particular PWM signal for each of the example switches 104a, 104b to enable and/or disable the example switches 104a, 104b to toggle between charging and discharging the example inductor 106. In such an example, the driver(s) 103 to transmit one or more control signals to the one or more switches 104a, 104b based on the determined PWM signal(s). At block 502, the example state machine 112 obtain the temperature corresponding to the switches 104a, 104b. For example, the state machine 112 may obtain value(s) corresponding to the temperature sensors 110a, 110b that correspond to a temperature.

At block 504, the example state machine 112 determines if a fault (e.g., a thermal fault) has occurred at one or more of the switches 104a, 104b. For example, the state machine 112 may compare the temperature value from the temperature sensors 110a, 110b to a preset threshold (e.g., based on user and/or manufacturer preferences). In this manner, if the either of the temperature values is above the threshold, the state machine 112 determines that a fault has occurred. If the example state machine 112 determines that a fault has not occurred (block 504: NO), the state machine 112 continues to monitor the temperature until a fault occurs. Alternatively, a controller may be coupled to the temperature sensors 110a, 110b and may determine if a fault has occurred. In such an example, the controller may transmit a fault signal to the state machine 112 to identify the fault. If the example state machine 112 determines that a fault has occurred (block 504: YES), the state machine 112 stops the control signal (block 506), to initiate an over-temperature protocol to attempt reduce the temperature to prevent damage to the power stage 100. For example, the state machine 112 and/or the controller may instruct the driver(s) 103 to stop transmitting PWM signals to the gates of the example switches(s) 1041, 104b.

At block 508, the example state machine 112 enables diode emulation mode of the example switch 104a, 104b corresponding to the fault (e.g., if the temperature sensor 110a corresponds to the fault, then the state machine 112 enables diode emulation mode of the switch 104a). The example state machine 112 enables diode emulation mode by transmitting a control signal (e.g., a high voltage) to the corresponding diode emulation control circuit 114a, 114b to enable the corresponding diode emulation control circuit 114a, 114b. At block 510, the example state machine 112 determine if the fault is still occurring (e.g., if the thermal fault ended). For example, the state machine 112 continues to compare the temperature(s) of the temperature sensor(s) 110a, 110b to the threshold to determine if the fault is still occurring and/or the state machine 112 may receive a signal from the controller identifying the end of the fault. If the example state machine 112 determines that the fault is still occurring (block 510: YES), the state machine 112 maintains the control signal to enable diode emulation mode. If the example state machine 112 determines that the fault is not still occurring (block 510: NO) (e.g., the thermal fault has ended because the temperature is below the threshold), the example state machine 112 and/or the controller disable diode emulation mode of the corresponding switch(es) 104a, 104b (block 512). The example state machine 112 enables diode emulation mode by transmitting a control signal (e.g., a low voltage) to the corresponding diode emulation control circuit 114a, 114b to disable the corresponding diode emulation control circuit 114a, 114b. At block 514, the example driver(s) 103 restart(s) the control signal(s) (e.g., the PWM signals to enable and/or disable the example switches 104a, 104b). For example, the state machine 112 and/or the controller may instruct the driver(s) 103 to restart the transmission of the PWM signals to the gates of the example switches(s) 1041, 104b.

FIG. 6A is an example flowchart 600 representative of example machine readable instructions that may be executed by the example diode emulation control circuit 114a of FIG. 2A to control the example switch 104a during a fault to prevent third quadrant mode. Although the flowchart 600 of FIG. 6 is described in conjunction with the example diode emulation control circuit 114a of FIG. 2, other type(s) of diode emulation control circuit(s), the example diode emulation control circuit 114b of FIGS. 1A, C-D and/or 2A, and/or other type(s) of processor(s) may be utilized instead.

Initially, in response to a fault (e.g., an over-temperature) fault, the example state machine 112 transmits a high voltage to the example switch 200a to enable the switch. Accordingly, if the example switch 200a receives a high voltage from the example state machine 112, the switch 200a is enabled to provide power (e.g., using Vdd) to the example differential amplifier 202a and the example comparator 204a. If there is not a fault (e.g., over-temperature fault), the state machine 112 outputs a low voltage to the switch 200a and the switch 200a is disabled to disable the example differential amplifier 202a and the example comparator 204a.

If diode mode is not enabled (e.g., the voltage from the state machine 112 is low) (block 602: NO), the diode emulation control circuit 114a remains disabled until the state machine 112 triggers an over-temperature protocol. If diode mode is enabled (e.g., the voltage from the state machine 112 is high) (block 602: YES), the switch 200a closes to provide power to the example differential amplifier 202a and the example comparator 204a, thereby causing the example differential amplifier 202a to determine the Vds of the switch 104a (e.g., whether Vds is positive or negative) (block 604). At block 606, the example differential amplifier 202a determines if the Vds of the switch 104a is negative. For example, the differential amplifier 202a determines the difference between the drain voltage of the switch 104a and the source voltage of the switch 104a and outputs a voltage corresponding to the difference. A positive Vds corresponds to current from the output load/capacitor 108 and a negative Vds corresponds to current from the inductor 106.

If the example differential amplifier 202a determines that the Vds of the example switch 104a is not negative (block 606: NO), the switch 104a remains disabled (e.g., off) and the process returns to block 604. If the example differential amplifier 202a determines that the Vds of the example switch 104a is negative (block 606: YES), the example comparator 204a turns on (e.g., enables) the example switch 104a (block 608). For example, the example comparator 204a compares the output of the differential amplifier 202a to 0V. Accordingly, when the Vds is negative, the comparator 204a will output a high voltage to the gate of the example switch 104a to enable the example switch 104a. As described above, enabling the switch 104a during a thermal fault prevents third quadrant mode of the switch 104a, thereby preventing the high power dissipation corresponding to third quadrant mode.

At block 610, the example differential amplifier 202a determines the Vds of the switch 104a. At block 612, the example differential amplifier 202a determines if the Vds of the switch 104a is positive. For example, the differential amplifier 202a determines the difference between the drain voltage of the switch 104a and the source voltage of the switch 104a and outputs a voltage corresponding to the difference.

If the example differential amplifier 202a determines that the Vds of the example switch 104a is not positive (block 612: NO), the switch 104a remains enabled and the process returns to block 610. If the example differential amplifier 202a determines that the Vds of the example switch 104a is positive (block 612: YES), the example comparator 204a turns off (e.g., disables) the example switch 104a (block 614). For example, the example comparator 204a compares the output of the differential amplifier 202a to 0V. Accordingly, when the Vds is positive, the comparator 204a will output a low voltage to the gate of the example switch 104a to disable the example switch 104a. As described above, disabling the example switch 104a when the current is positive (e.g., flowing from the drain to the source of the switch 104a) prevents the output load and/or capacitor 108 from charging the example inductor 106.

At block 616, the example switch 200a determines if diode emulation mode is still enabled (e.g., a thermal fault is still occurring causing the state machine 112 to transmit a high signal to enable the switch 200a). If the example switch 200a determines that diode emulation mode is still enabled (block 616: YES), the process returns to block 604. If the example switch 200a determines that diode emulation mode is not still enabled (block 616: NO), the switch 200a is disabled and the process ends.

Figure 6B:
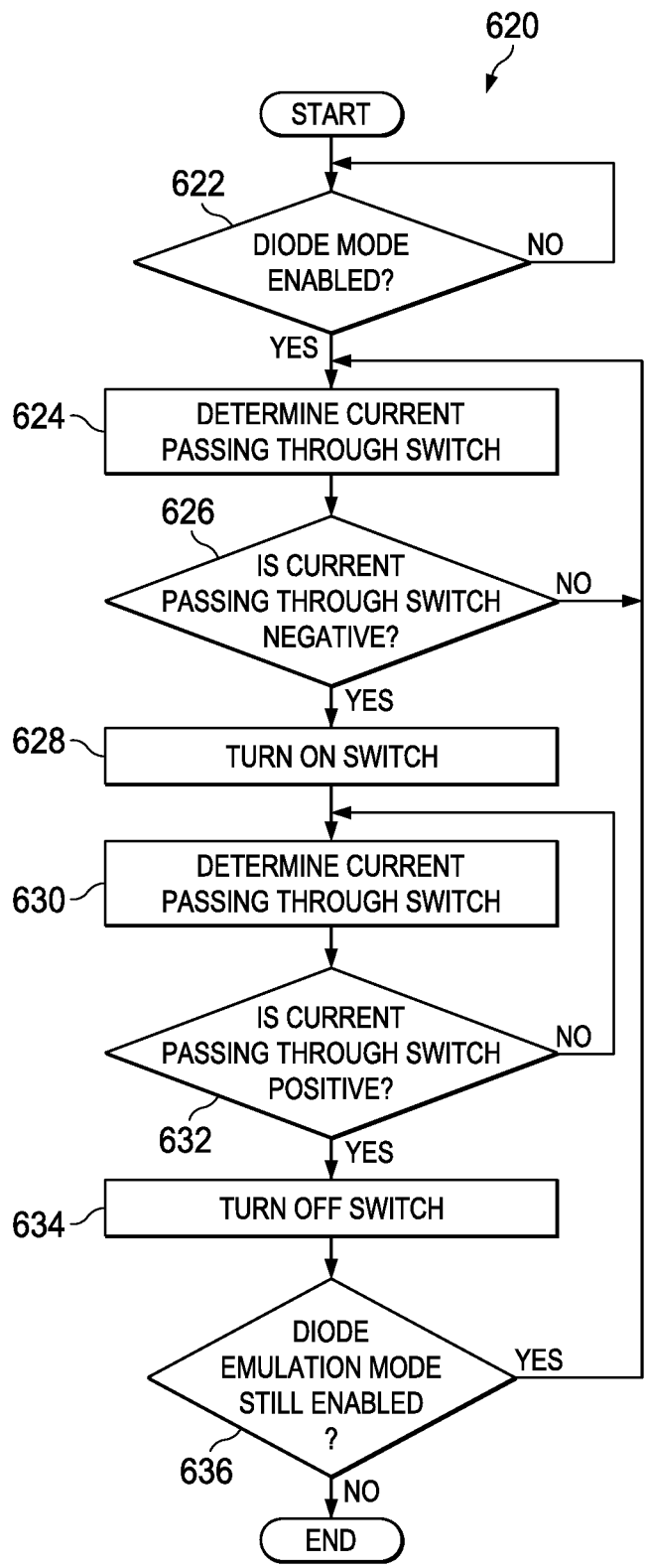

FIG. 6B is an example flowchart 620 representative of example machine readable instructions that may be executed by the example diode emulation control circuit 118a of FIG. 2b to control the example switch 104a during a fault to prevent third quadrant mode. Although the flowchart 620 of FIG. 6B is described in conjunction with the example diode emulation control circuit 118a of FIG. 2B, other type(s) of diode emulation control circuit(s), the example diode emulation control circuit 118b of FIGS. 1B and/or 2B, and/or other type(s) of processor(s) may be utilized instead.

Initially, in response to a thermal fault (e.g., an over-temperature fault), the example state machine 112 transmits a high voltage to the example switch 200a to enable the switch. Accordingly, if the example switch 200a receives a high voltage from the example state machine 112, the switch 200a is enabled to provide power (e.g., using Vdd) to the example comparator 204a. If there is not fault/thermal shutdown, the state machine 112 outputs a low voltage to the switch 200a and the switch 200a is disabled to disable the example comparator 204a.

If diode mode is not enabled (e.g., the voltage from the state machine 112 is low) (block 622: NO), the diode emulation control circuit 114a remains disabled until the state machine 112 triggers an over-temperature fault. If diode mode is enabled (e.g., the voltage from the state machine 112 is high) (block 622: YES), the switch 200a closes to provide power to the example comparator 204a, thereby causing the example comparator 204a to determine the current from the source of the switch 104a to the inductor 106 (block 624). At block 626, the example comparator 204a determines if the current passing through the switch 104a is a reverse current (e.g., the current is flowing from the source of the switch 104a to the drain of the switch 104a). For example, the comparator 204b compares the current at the source of the switch 104a (e.g., measured by the current sensor 116a) to 0V to determine if the current is positive or negative.

If the example comparator 204b determines that the current passing through the example switch 104a is not a reverse current (e.g., the current is positive or zero) (block 626: NO), the switch 104a remains disabled (e.g., off) and the process returns to block 624. If the example comparator 204a determines that the current passing through the example switch 104a is a reverse current (block 626: YES), the example comparator 204a turns on (e.g., enables) the example switch 104a (block 628). For example, when the current sensed by the current sensor 116a is negative, the comparator 204a will output a high voltage to the gate of the example switch 104a to enable the example switch 104a. As described above, enabling the switch 104a during a thermal fault prevents third quadrant mode of the switch 104a, thereby preventing the high power dissipation corresponding to third quadrant mode.

At block 630, the example comparator 204a determines the current passing through the switch 104a. At block 632, the example comparator 204a determines if the current passing through the switch 104a is positive. For example, the comparator 204a compares the current from the current sensor 116a to 0V to determine if the current is positive or in reverse.

If the example comparator 204a determines that current passing through the example switch 104a is not positive (block 632: NO), the switch 104a remains enabled and the process returns to block 630. If the example comparator 204a determines that the current passing through the example switch 104a is positive (block 632: YES), the example comparator 204a turns off (e.g., disables) the example switch 104a (block 634). For example, when the current is positive, the comparator 204a will output a low voltage to the gate of the example switch 104a to disable the example switch 104a. As described above, disabling the example switch 104a when the current is positive (e.g., flowing from the drain to the source of the switch 104a) prevents the output load and/or capacitor 108 from charging the example inductor 106.

At block 636, the example switch 200a determines if diode emulation mode is still enabled (e.g., a thermal fault is still occurring causing the state machine 112 to transmit a high signal to enable the switch 200a). If the example switch 200a determines that diode emulation mode is still enabled (block 636: YES), the process returns to block 624. If the example switch 200a determines that diode emulation mode is not still enabled (block 636: NO), the switch 200a is disabled and the process ends.

Figure 7:
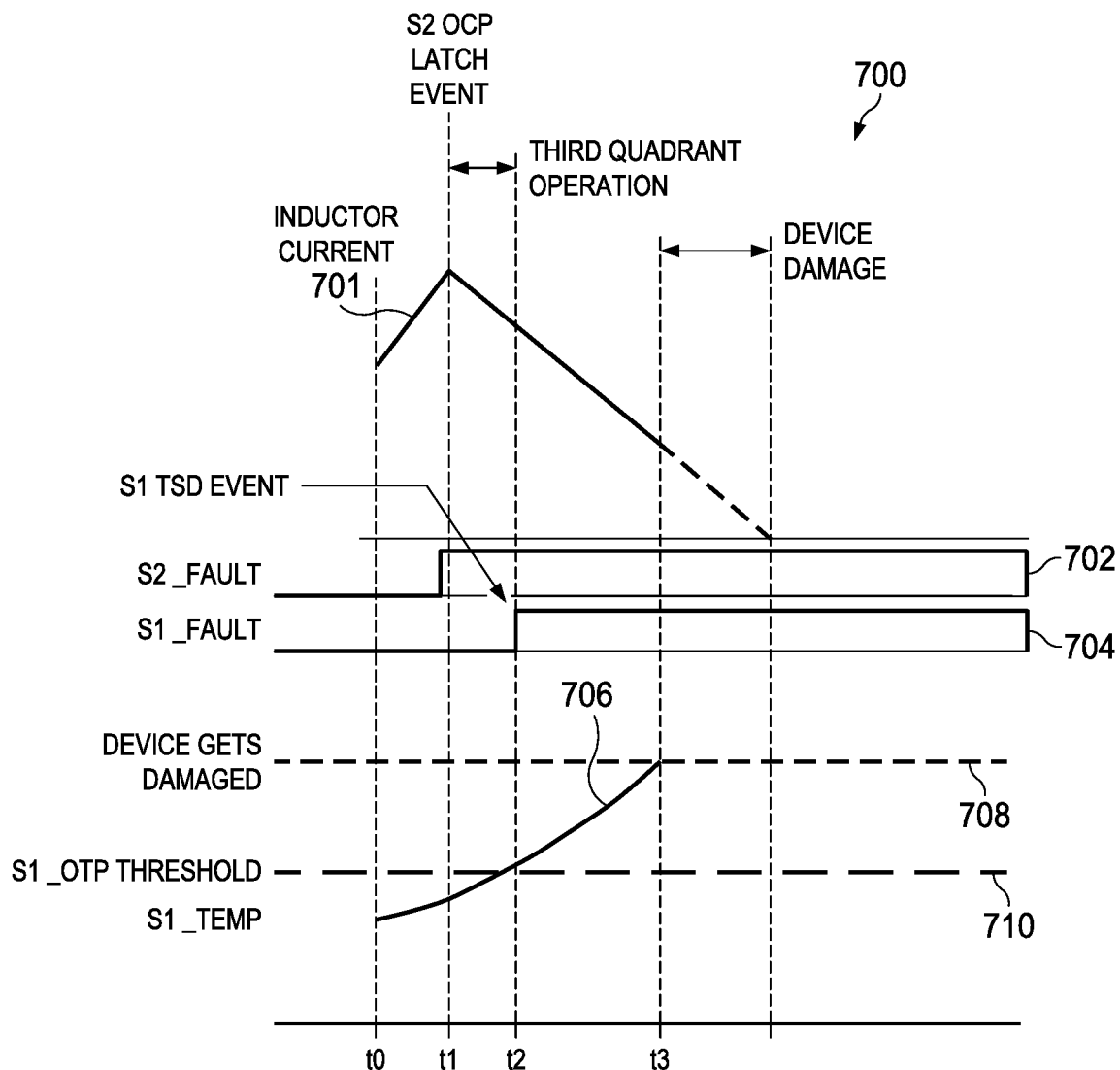
FIG. 7 is a timing diagram representative of a fault-based shutdown without implementation of the diode emulation control circuit of FIGS. 1A-D and/or 2A-B.

FIG. 7 is an example timing diagram 700 corresponding to an over-temperature fault of the example power stage 100 without entering diode emulation mode. The example timing diagram 700 includes an example inductor current 701 (e.g., corresponding to the current flowing through the example inductor 106), a second example control signal 702 (e.g., corresponding to a fault at switch s2 104b), a first example control signal 704 (e.g., corresponding to a fault at switch s1 104a), an example damage temperature 708, an example temperature threshold 710, and an example temperature 706 (e.g., sensed by the example temperature sensor 110a).

At time t0, the example temperature 706 is below the example temperature threshold 710 and the inductor current 701 raises during normal operation (e.g., PWM operation) of the half-bridge switches 104a, 104b. At time t1, the example control signal 702 is triggered corresponding to a fault at the example switch 104b. Accordingly, the example switches 104a, 104b are disabled, causing the example inductor current 701 to decrease. However, from time t1 to time t2, the inductor current 701 flows toward the source of the example switch 104a, thereby causing the switch 104a to enter third quadrant mode. As described above, third quadrant mode causes a large voltage drop across the example switch 104a which corresponds to large power dissipation. Accordingly, as the inductor current 701 decreases, the example temperature 706 corresponding to the example switch 104a continues to increase from time t2 to time t3. At time t3, the example temperature 706 increases to a temperature above the example damage temperature 708, thereby causing damage to the example power stage 100.

Figure 8:
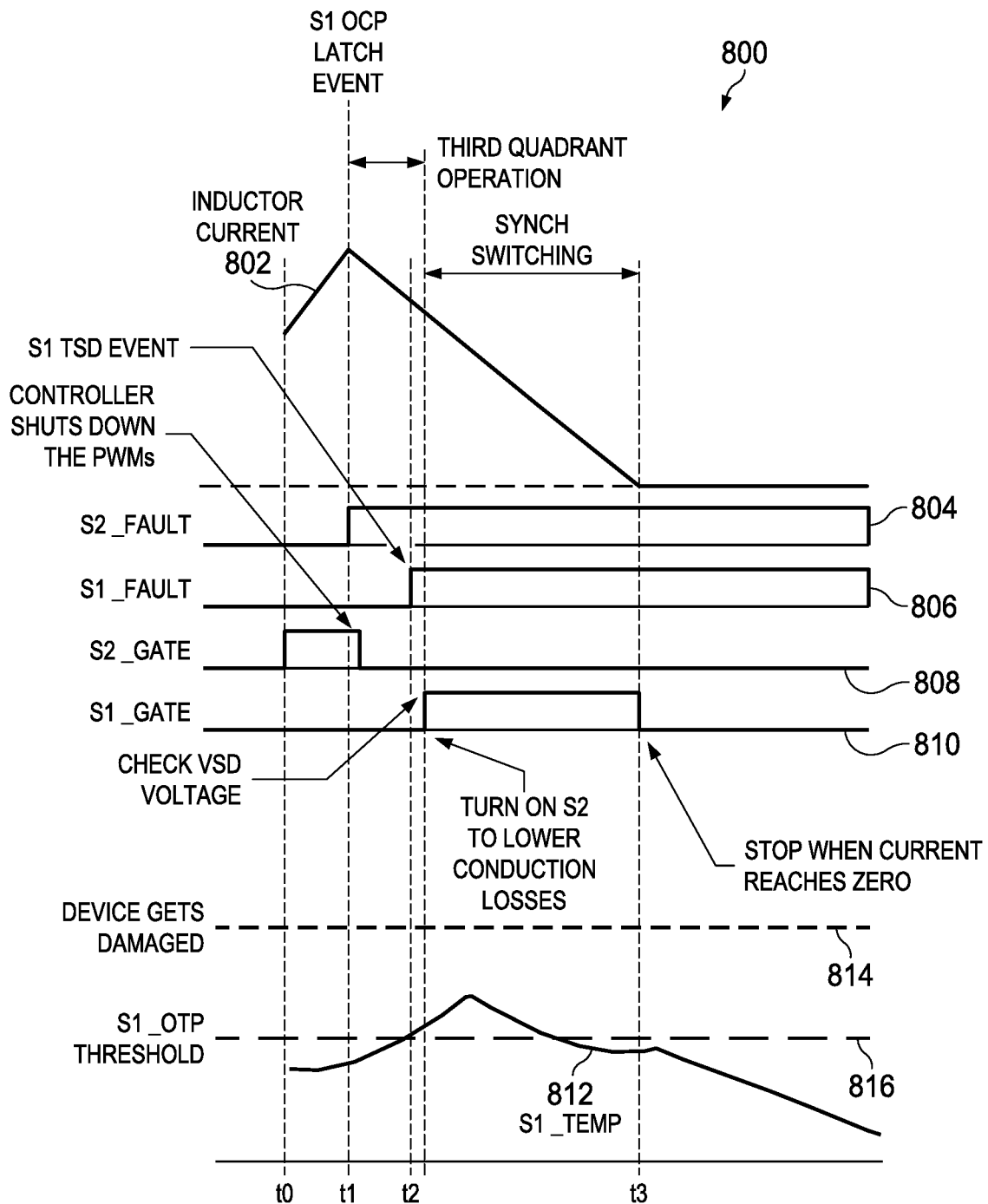
FIG. 8 is a timing diagram representative of a fault-based shutdown while implementing the diode emulation control circuit of FIGS. 1A-D and/or 2A-B.

FIG. 8 is an example timing diagram 800 corresponding to an over-temperature fault of the example power converter 800 with entering diode emulation mode by enabling the example diode emulation control circuit 114a in response to a fault. The example timing diagram 800 includes an example inductor current 802 (e.g., corresponding to the current flowing through the example inductor 106), a second example control signal 804 (e.g., corresponding to a fault at switch s2 104b), a first example control signal 806 (e.g., corresponding to a fault at switch s1 104a), an example second gate signal 808 (e.g., corresponding to the signal at the gate of the second switch 104b), an example first gate signal 810 (e.g., corresponding to the signal at the gate of the first switch 104a), an example temperature 812 (e.g., sensed by the example temperature sensor 110a), an example damage temperature 814, and an example temperature threshold 816.

At time t0, the example temperature 812 is below the example temperature threshold 816 and the inductor current 802 raises during normal operation (e.g., PWM operation) of the half-bridge switches 104a, 104b. At time t1, the example control signal 804 is triggered corresponding to a fault at the example switch 104b and the PWM signal ceases. Accordingly, the example switches 104a, 104b are disabled, causing the example inductor current 802 to decrease. From time t1 to time t2, the inductor current 802 flows toward the source of the example switch 104a, thereby causing the switch 104a to enter third quadrant mode. As described above, third quadrant mode causes a large voltage drop across the example switch 104a which corresponds to large power dissipation. However, at time t2, after the temperature 812 raises above the example threshold 816, the example state machine 112 triggers the example fault 806, which enables the example diode emulation control circuit 114a. Accordingly, because the inductor current 802 is flowing toward the drain of the example switch 104a, the example diode emulation control circuit 114a increases the example gate voltage 810 to enable (e.g., turn on) the example switch 104a. Enabling (e.g., turning on) the example switch 104a prevents the third quadrant operation of the switch 104a, which decreases the voltage drop across the switch 104a, thereby reducing the amount of power dissipation. Accordingly, one the example gate voltage 810 is increased, the temperature 812 begins to decrease, thereby avoiding the example damage temperature 814. At time t3, the inductor current 802 reaches zero. Accordingly, the current is no longer flowing toward the source of the example switch 104*a* and the example diode emulation control circuit 114*a* lowers the example gate voltage 810 to disable the example switch 104*a*. In this manner, current from the example output load/capacitor 108 will be blocked to prevent the example inductor 106 from charging.

From the foregoing, it will be appreciated that example methods, apparatus, and articles of manufacture facilitate a fault triggered diode emulation mode of a transistor. Examples disclosed herein control a GaN transistor to emulate a diode in response to an over-temperature fault. In this manner, third quadrant operation can be avoided to decrease power dissipation and avoid access temperatures that may damage the GaN transistor and/or any other component. Accordingly, examples disclosed herein provide an improvement to previous power converters by controlling the switches during a thermal fault to avoid third quadrant operation.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A system comprising:
   a driver configured to output a control signal to a gate of a transistor of a power converter; and
   a diode emulation control circuit configured to, in response to a fault corresponding to the transistor and in response to determining a current direction from a source of the transistor to a drain of the transistor, adjust the control signal for enabling diode emulation of the transistor.

2. The system of claim 1, further comprising a state machine configured to identify the fault when a sensed temperature is above a threshold.

3. The system of claim 2, wherein the control signal is a first control signal, the state machine configured to transmit a second control signal to adjust the control signal for enabling the diode emulation, the diode emulation control circuit being disabled when the sensed temperature is below the threshold.

4. The system of claim 2, wherein the state machine is adapted to be coupled to a temperature sensor, the state machine configured to compare a signal from the temperature sensor to the threshold.

5. The system of claim 2, wherein the sensed temperature is a temperature corresponding to the transistor.

6. The system of claim 1, wherein the diode emulation control circuit is configured to determine the current direction from the source to the drain based on a measurement from a current sensor.

7. The system of claim 1, wherein the diode emulation control circuit is configured to determine a voltage drop across the source and the drain.

8. The system of claim 7, wherein the diode emulation control circuit is configured to determine the current direction from the source to the drain based on the voltage drop.

9. The system of claim 1, the diode emulation control circuit configured to, in response to the fault corresponding to the transistor and in response to determining a second current direction from the drain of the transistor to the source of the transistor, adjust the control signal for disabling the diode emulation of the transistor.

10. The system of claim 1, wherein the driver is to, in response to the fault corresponding to the transistor, halt the control signal.

11. The system of claim 1, wherein the diode emulation control circuit is configured to adjust the control signal for enabling the transistor by providing a high voltage to the gate of the transistor.

12. The system of claim 1, wherein the transistor is a gallium nitride transistor.

13. An apparatus comprising:
    a driver configured to transmit a control signal to a gate of a transistor of a power converter; and
    a state machine configured to, in response to a thermal fault, instruct a diode emulation control circuit to enable the transistor to enable current to flow through the transistor.

14. The apparatus of claim 13, wherein the driver is configured to, in response to the thermal fault, stop the control signal.

15. The apparatus of claim 13, wherein the state machine is configured to compare a sensed temperature to a threshold to determine the thermal fault.

16. The apparatus of claim 13, wherein the diode emulation control circuit is configured to instruct the transistor to operate as a diode by disabling the transistor when a drain-to-source current is positive and enabling the transistor when the drain-to-source current is negative.

17. The apparatus of claim 16, wherein:
    disabling the transistor prevents current from charging an inductor; and
    enabling the transistor enables the inductor to discharge.

18. The apparatus of claim 13, wherein the state machine is configured to enable the diode emulation control circuit to prevent the transistor from operating in third quadrant mode.

19. The apparatus of claim 13, wherein the transistor is a gallium nitride transistor.

20. The apparatus of claim 13, wherein the state machine is configured to enable the diode emulation control circuit to enable the transistor to enable the current to flow through the transistor when the current corresponds to a first direction.

21. The apparatus of claim 20, wherein the state machine is configured to enable the diode emulation control circuit to disable the transistor to prevent the current from flowing though the transistor when the current corresponds to a second direction opposite the first direction.

22. The apparatus of claim 13, wherein the state machine is configured to disable the diode emulation control circuit when a fault is not occurring.

23. A system comprising:
    a driver having a driver output adapted to be coupled to a gate of a transistor of a power converter;
    a state machine coupled to the driver; and
    a diode emulation control circuit coupled to the state machine, the diode emulation control circuit coupled to the driver output.

24. The system of claim 23, wherein the state machine is adapted to be coupled to a temperature sensor corresponding to the transistor.

25. The system of claim 23, the diode emulation control circuit comprising a switch, wherein the diode emulation control circuit is enabled when the switch is closed and the diode emulation control circuit is disabled when the switch is open.

26. The system of claim 23, wherein the diode emulation control circuit comprises a differential amplifier adapted to be coupled to a drain of the transistor and to a source of the transistor.

27. The system of claim 26, wherein the diode emulation control circuit comprises a comparator having a first input, a second input, and a comparator output, the first input coupled to an output of the differential amplifier, the second input coupled to a reference node, and the comparator output to be coupled to the gate of the transistor.

28. The system of claim 23, further comprising a current sensor coupled to the diode emulation control circuit.

29. The system of claim 28, further comprising a comparator having a first input, a second input, and a comparator output, the first input coupled to the current sensor, the second input coupled to a reference node, and the comparator output coupled to the gate of the transistor.

30. A system comprising:
a driver configured to output a control signal to a gate of a transistor of a power converter; and
a diode emulation control circuit configured to, in response to a fault corresponding to the transistor and in response to determining a voltage drop from a source of the transistor to a drain of the transistor, adjust the control signal for enabling a diode emulation of the transistor.

31. The system of claim 30, further comprising a state machine configured to identify the fault when a sensed temperature is above a threshold.

32. The system of claim 31, wherein the control signal is a first control signal, the state machine configured to transmit a second control signal to adjust the first control signal for enabling the diode emulation control circuit in response to the fault, the diode emulation control circuit being disabled when the sensed temperature is below the threshold.

33. The system of claim 31, wherein the state machine is adapted to be coupled to a temperature sensor, the state machine to compare a signal from the temperature sensor to the threshold.

34. The system of claim 31, wherein the sensed temperature is a temperature corresponding to the transistor.

35. The system of claim 30, wherein the diode emulation control circuit is configured to determine the voltage drop from the source to the drain based on a comparison of a difference between a first voltage at the source and a second voltage at the drain to a reference voltage.

36. The system of claim 30, wherein the diode emulation control circuit is configured to determine the voltage drop across the source and the drain.

37. The system of claim 30, the diode emulation control circuit configured to, in response to the fault corresponding to the transistor and in response to determining a second voltage drop from the drain of the transistor to the source of the transistor, adjust the control signal for disabling the diode emulation of the transistor.

38. The system of claim 30, wherein the driver is configured to, in response to the fault corresponding to the transistor, halt the control signal.

39. The system of claim 30, wherein the diode emulation control circuit is configured to adjust the control signal for enabling the transistor by providing a high voltage to the gate of the transistor.

40. The system of claim 30, wherein the transistor is a gallium nitride transistor.

* * * * *